(12) United States Patent
Cha et al.

(10) Patent No.: US 12,238,992 B2
(45) Date of Patent: Feb. 25, 2025

(54) DISPLAY DEVICE, ELECTRONIC DEVICE, AND METHOD OF MANUFACTURING THE DISPLAY DEVICE

(71) Applicant: Samsung Display Co., Ltd., Yongin-si (KR)

(72) Inventors: Myounggeun Cha, Seoul (KR); Soyoung Koo, Hwaseong-si (KR); Donghwan Shim, Hwaseong-si (KR); Sanggun Choi, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 454 days.

(21) Appl. No.: 17/825,724

(22) Filed: May 26, 2022

(65) Prior Publication Data

US 2022/0406877 A1 Dec. 22, 2022

(30) Foreign Application Priority Data

Jun. 16, 2021 (KR) .......................... 10-2021-0078318

(51) Int. Cl.
 *H10K 59/131* (2023.01)
 *H10K 59/12* (2023.01)
 *H10K 71/00* (2023.01)

(52) U.S. Cl.
 CPC .......... *H10K 59/131* (2023.02); *H10K 71/00* (2023.02); *H10K 59/1201* (2023.02)

(58) Field of Classification Search
 None
 See application file for complete search history.

(56) References Cited

U.S. PATENT DOCUMENTS

| 10,770,522 | B2 | 9/2020 | Ueno |
| 11,088,284 | B2 | 8/2021 | Son et al. |
| 11,145,248 | B2 | 10/2021 | Park |
| 11,393,883 | B2 | 7/2022 | Bae et al. |
| 11,417,717 | B2 | 8/2022 | Lee et al. |
| 2020/0258967 | A1 | 8/2020 | Kim et al. |
| 2020/0286972 | A1 | 9/2020 | Seo et al. |
| 2021/0083221 | A1 | 3/2021 | Lee |

(Continued)

FOREIGN PATENT DOCUMENTS

| CN | 217847961 U | * 11/2022 | ......... H01L 27/3276 |
| CN | 118411929 A | * 7/2024 | ............ G09G 3/006 |

(Continued)

OTHER PUBLICATIONS

Kim et al, "Effects of Ion Implantation Doping on the Characteristics of Amorphous Indium Gallium Zinc Oxide Thin Films" Science of Advanced Materials, vol. 8, No. 2, pp. 267-271, www.aspbs.com/sam, Sep. 16, 2021.

*Primary Examiner* — Michael Lebentritt
(74) *Attorney, Agent, or Firm* — Lewis Roca Rothgerber Christie LLP

(57) ABSTRACT

A display device includes a first pixel and a second pixel. A light emitting element and a pixel circuit of the second pixel are in a second area. The first pixel includes a silicon transistor and an oxide transistor in the second area. The first pixel includes a connection line that electrically connects one of the silicon transistor and the oxide transistor to a light emitting element in a first area. The connection line is on the same layer as the oxide semiconductor pattern and includes a transparent conductive oxide.

24 Claims, 21 Drawing Sheets

(56) References Cited

U.S. PATENT DOCUMENTS

| | | | |
|---|---|---|---|
| 2021/0202570 A1* | 7/2021 | Chu | .................. H10K 59/124 |
| 2022/0352281 A1* | 11/2022 | Shin | .................. H01L 27/1225 |
| 2023/0389391 A1* | 11/2023 | Song | ................ H10K 59/1213 |
| 2024/0057398 A1* | 2/2024 | Park | .................. H10K 59/1216 |
| 2024/0180011 A1* | 5/2024 | Choi | .................. H10K 59/126 |
| 2024/0251630 A1* | 7/2024 | Song | .................... H10K 59/60 |

FOREIGN PATENT DOCUMENTS

| | | | |
|---|---|---|---|
| JP | 2024099488 A * | 7/2024 | ........... G06F 3/0412 |
| KR | 10-2020-0061443 A | 6/2020 | |
| KR | 10-2020-0072928 A | 6/2020 | |
| KR | 10-2020-0097371 A | 8/2020 | |
| KR | 10-2020-0108146 A | 9/2020 | |
| KR | 10-2020-0116576 A | 10/2020 | |
| WO | 2020/219267 A1 | 10/2020 | |

* cited by examiner

DISPLAY DEVICE, ELECTRONIC DEVICE, AND METHOD OF MANUFACTURING THE DISPLAY DEVICE

CROSS-REFERENCE TO RELATED APPLICATION

The present application claims to and the benefit of Korean Patent Application No. 10-2021-0078318, filed on Jun. 16, 2021, the contents of which are hereby incorporated by reference in its entirety.

BACKGROUND

1. Field

Aspects of some embodiments of the present disclosure relate to a display device, an electronic device including the display device, and a method of manufacturing the display device.

2. Description of the Related Art

An electronic device may include various electronic parts such as a display panel and an electronic module. The electronic module includes a camera, an infrared sensor, or a proximity sensor. The electronic module may be located under the display panel. Some areas of the display panel have a transmittance higher than that of the other areas of the display panel. The electronic module may receive an optical signal or output the optical signal through the areas with the relatively high transmittance.

The above information disclosed in this Background section is only for enhancement of understanding of the background and therefore the information discussed in this Background section does not necessarily constitute prior art.

SUMMARY

Aspects of some embodiments of the present disclosure relate to a display device including a display area through which an optical signal transmits, an electronic device including the display device, and a method of manufacturing the display device.

Aspects of some embodiments of the present disclosure include a display device having a simple stacked structure.

Aspects of some embodiments of the present disclosure include an electronic device including the display device.

Aspects of some embodiments of the present disclosure include a method of manufacturing the display device, which is simplified.

Aspects of some embodiments of the inventive concept include a display device including a display panel including a base layer including a display area including a first area and a second area adjacent to the first area and a peripheral area adjacent to the display area, an insulating layer on the base layer, and first and second pixels on the base layer. The first pixel includes a first light emitting element in the first area and a first pixel circuit electrically connected to the first light emitting element. The second pixel includes a second light emitting element in the second area and a second pixel circuit electrically connected to the second light emitting element and in the second area. The first pixel circuit includes a first transistor including an oxide semiconductor pattern including a drain area, an active area, and a source area and a gate overlapping the active area and in the second area or the peripheral area, a second transistor including a silicon semiconductor pattern including a drain area, an active area, and a source area and a gate overlapping the active area and in the second area or the peripheral area, and a connection line electrically connecting the first transistor or the second transistor to the first light emitting element, overlapping at least the first area, on the same layer as the oxide semiconductor pattern, and including a transparent conductive oxide.

According to some embodiments, the display area further includes a third area adjacent to the second area, the display panel further includes a third pixel in the third area, the third pixel includes a third light emitting element in the third area and a third pixel circuit electrically connected to the third light emitting element and in the third area, and the number of the first light emitting elements is smaller than the number of the third light emitting elements based on a unit area.

According to some embodiments, the insulating layer includes a first insulating layer and a second insulating layer, the oxide semiconductor pattern is on the first insulating layer, the silicon semiconductor pattern is under the first insulating layer, and the second insulating layer covers the oxide semiconductor pattern.

According to some embodiments, the second insulating layer covers the connection line.

According to some embodiments, the second insulating layer is provided with an opening defined therethrough to correspond to the first area, and at least a portion of the connection line is exposed without being covered by the second insulating layer.

According to some embodiments, the insulating layer further includes a third insulating layer filled in the opening and on the second insulating layer.

According to some embodiments, the first pixel circuit further includes a connection electrode, and the connection electrode is on the third insulating layer and connected to the connection line via a contact hole defined through the third insulating layer.

According to some embodiments, the connection line has a conductivity higher than a conductivity of the drain area and the source area of the oxide semiconductor pattern.

According to some embodiments, the connection line has a higher fluorine content than a fluorine content of the drain area and the source area of the oxide semiconductor pattern.

According to some embodiments, the connection line further includes aluminum (Al), arsenic (As), boron (B), or silicon (Si) compared with the drain area and the source area of the oxide semiconductor pattern.

According to some embodiments, the insulating layer includes an insulating pattern overlapping the gate of the first transistor and between the gate of the first transistor and the active area of the first transistor, and the drain area and the source area of the first transistor are exposed without being covered by the insulating pattern in a plane.

According to some embodiments, the connection line overlaps the second area.

According to some embodiments, the first pixel circuit further includes a connection electrode, the first light emitting element includes a first electrode having an oval shape, the connection electrode is directly connected to the connection line, and the first electrode of the first light emitting element is directly connected to the connection electrode.

According to some embodiments, the second light emitting element includes a first electrode having a curved edge, and the first electrode of the second light emitting element has an area smaller than an area of the first electrode of the first light emitting element.

According to some embodiments, the display device further includes a window coupled with the display panel, and the window includes a base film and a bezel pattern overlapping the peripheral area.

Aspects of some embodiments of the inventive concept include an electronic device including a display device including a sensing area through which an optical signal transmits, a display area adjacent to the sensing area, and a peripheral area adjacent to the display area and an electronic module under the display device, overlapping the sensing area, and receiving the optical signal. The sensing area includes an element area that overlaps a light emitting element and a transmission area that does not overlap the light emitting element. The display device includes a first pixel. The first pixel includes a first light emitting element in the element area and a first pixel circuit electrically connected to the first light emitting element. The first pixel circuit includes a transistor including an oxide semiconductor pattern and in the display area or the peripheral area, and a connection line electrically connecting the transistor to the first light emitting element, overlapping at least the display area, on the same layer as the oxide semiconductor pattern, and including a transparent conductive oxide.

According to some embodiments, the display device further includes a second pixel. The second pixel includes a second light emitting element in the display area and a second pixel circuit electrically connected to the second light emitting element and in the display area.

According to some embodiments, the display device includes a window. The window includes a base film and a bezel pattern overlapping the peripheral area.

According to some embodiments, the electronic module includes a camera module.

Aspects of some embodiments of the inventive concept provide a method of manufacturing a display device including a first pixel including a first light emitting element in a first area, a first silicon transistor in a second area, and a first oxide transistor in the second area and a second pixel including a second light emitting element in the second area, a second silicon transistor, and a second oxide transistor. The method includes forming the first silicon transistor overlapping the second area, forming an oxide semiconductor layer including an oxide semiconductor pattern of the first oxide transistor overlapping the second area and an oxide semiconductor line overlapping at least the first area, forming a gate of the first oxide transistor that overlaps an active area of the oxide semiconductor pattern of the first oxide transistor, forming an insulating layer to cover the gate of the first oxide transistor and the oxide semiconductor line, and forming the first light emitting element on the insulating layer and electrically connected to the oxide semiconductor line.

According to some embodiments, the method further includes doping the oxide semiconductor line using a dopant.

According to some embodiments, the dopant includes aluminum (Al), arsenic (As), boron (B), silicon (Si), or indium (In).

According to some embodiments, the method further includes dry etching the insulating layer using a fluorinated gas to form an opening corresponding to the first area through the insulating layer.

According to some embodiments, the method further includes forming the second silicon transistor overlapping the second area, forming the second oxide transistor overlapping the second area, and forming the second light emitting element overlapping the second area.

According to some embodiments, the forming of the second oxide transistor includes forming an oxide semiconductor pattern of the second oxide transistor overlapping the second area and forming a gate of the second oxide transistor that does not overlap a source area and a drain area of the oxide semiconductor pattern of the second oxide transistor and overlaps an active area of the oxide semiconductor pattern of the second oxide transistor. The forming of the oxide semiconductor pattern of the second oxide transistor is performed through the same and single process as the forming of the oxide semiconductor layer, and the forming of the gate of the second oxide transistor is performed through the same and single process as the forming of the gate of the first oxide transistor.

According to some embodiments of the present disclosure, an additional transparent conductive layer to connect the first pixel circuit and the first light emitting element may not be utilized. In addition, the connection line may be formed through the same process as at least one process among the manufacturing processes to form the oxide semiconductor pattern. Thus, the stacked structure of the display device may be relatively simplified.

According to some embodiments, the connection line has a relatively large conductivity, and thus, a driving current corresponding to a data signal is applied to the light emitting element in the first area.

BRIEF DESCRIPTION OF THE DRAWINGS

The above and other characteristics of embodiments according to the present disclosure will become readily apparent by reference to the following detailed description when considered in conjunction with the accompanying drawings wherein.

DETAILED DESCRIPTION

Figure 1:
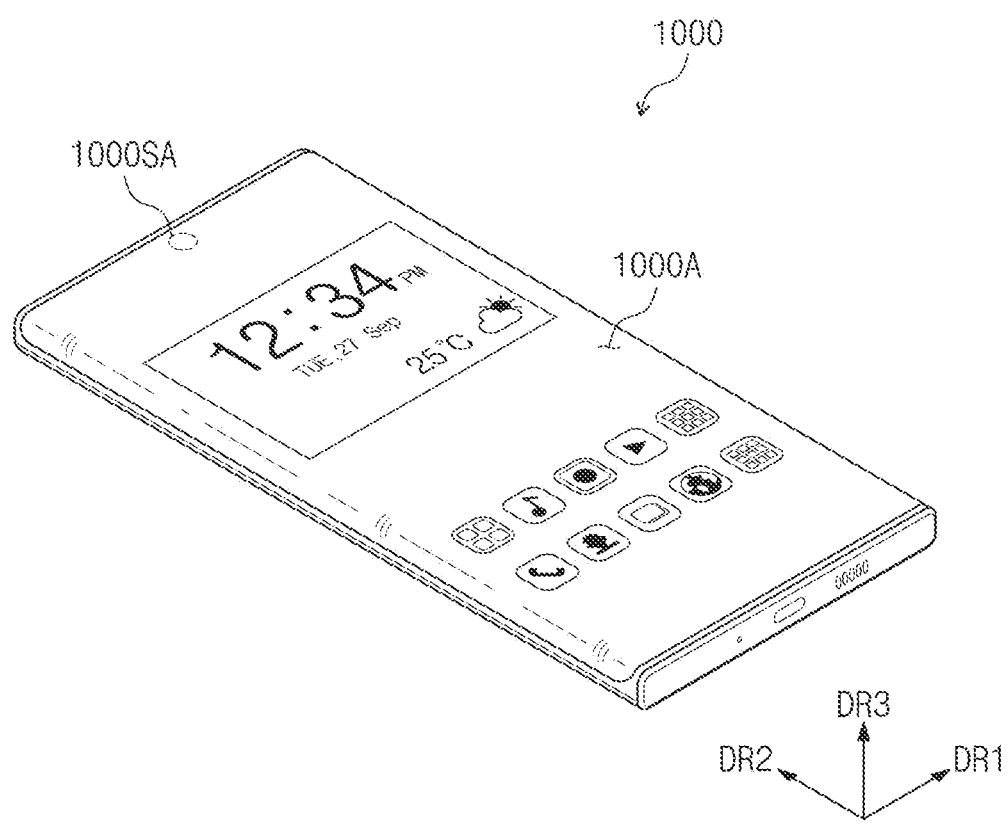
FIG. 1 is a perspective view showing an electronic device according to some embodiments of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as shown in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described with reference to accompanying drawings.

FIG. 1 is a perspective view showing an electronic device 1000 according to some embodiments of the present disclosure.

Referring to FIG. 1, the electronic device 1000 may be any suitable electronic device including a display device, and a mobile phone is shown as a representative example in the present embodiments. However, the electronic device 1000 should not be limited to the mobile phone, and the electronic device 1000 may be a tablet computer, a monitor, a television, a car navigation unit, a game unit, a wearable device, or any other suitable electronic device.

The electronic device 1000 may display images at a display area 1000A. The display area 1000A may include a plane defined by a first direction DR1 and a second direction DR2. The display area 1000A may further include curved surfaces bent from at least two sides of the plane. However, the shape of the display area 1000A is not limited thereto or thereby. For example, the display area 1000A may include only the plane, or the display area 1000A may further include two or more curved surfaces, e.g., four curved surfaces respectively bent from four sides of the plane.

An area of the display area 1000A may be defined as a sensing area 1000SA. FIG. 1 shows one sensing area 1000SA as a representative example, however, the number of the sensing areas 1000SA is not limited thereto or thereby. The sensing area 1000SA may be a portion of the display area 1000A, but the sensing area 1000SA may have a transmittance higher than that of the other areas of the display area 1000A with respect to an optical signal. Accordingly, the images may be displayed through the sensing area 1000SA, and the optical signal may be provided through the sensing area 1000SA.

The electronic device 1000 may include an electronic module located in an area overlapping the sensing area 1000SA. The electronic module may receive the optical signal provided from the outside through the sensing area 1000SA or may output the optical signal through the sensing area 1000SA. As an example, the electronic module may be a camera module, a sensor that measures a distance between an object and a mobile phone, such as a proximity sensor, a sensor that recognizes a part of a user's body, e.g., a fingerprint, an iris, or a face, or a small lamp that outputs a light, however, embodiments are not particularly limited, and the electronic module may include any suitable electronic device.

A third direction DR3 may indicate a normal line direction of the display area 1000A, i.e., a thickness direction of the electronic device 1000. Front (or upper) and rear (or lower) surfaces of each member of the electronic device 1000 may be distinguished from each other with respect to the third direction DR3.

Figure 2:
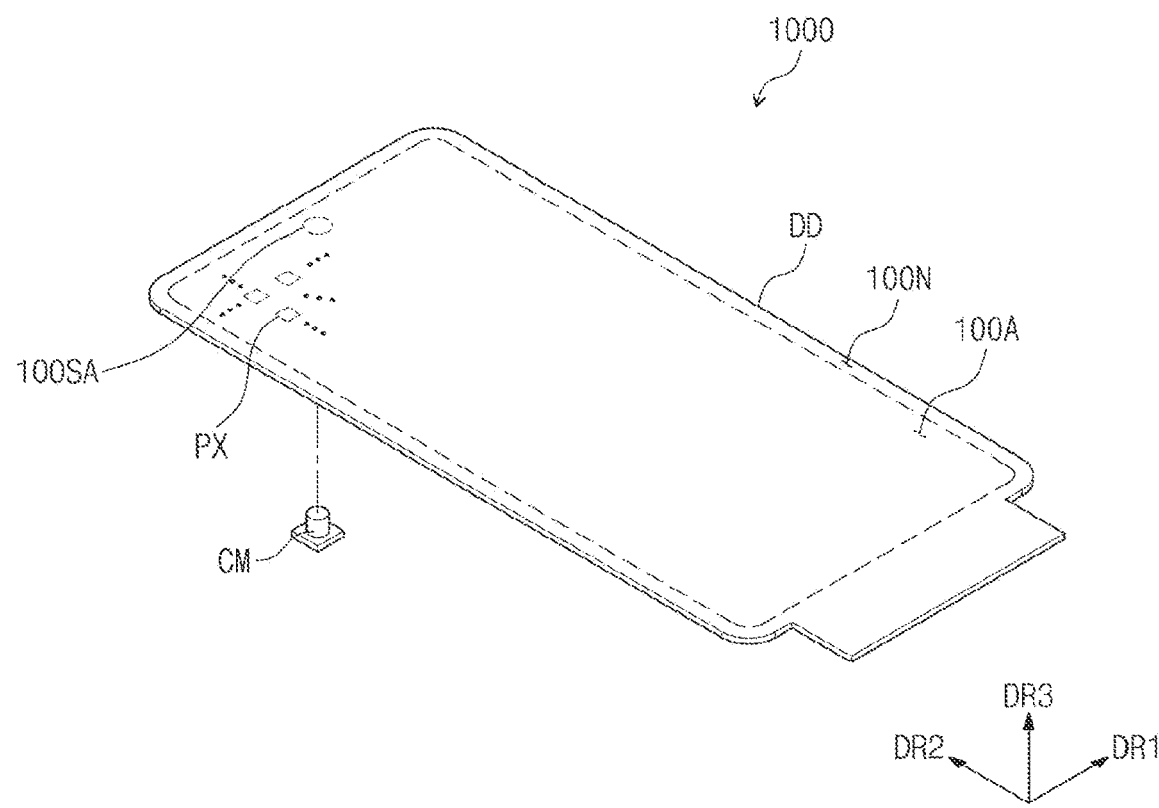
FIG. 2 is an exploded perspective view showing some components of an electronic device according to some embodiments of the present disclosure.

FIG. 2 is an exploded perspective view showing some components of the electronic device 1000 according to some embodiments of the present disclosure.

Referring to FIG. 2, the electronic device 1000 may include the display device DD and a camera module CM. The display device DD may generate the images and may sense an external input. The camera module CM may be located under the display device DD. When the display device DD is defined as a first electronic module for the electronic device 1000, the camera module CM may be defined as a second electronic module.

The display device DD may include a display area 100A and a peripheral area 100N. The display area 100A may correspond to the display area 1000A shown in FIG. 1. An area of the display device DD may be defined as a sensing area 100SA, and the sensing area 100SA may have a transmittance higher than that of the other area (hereinafter, referred to as a main display area) of the display area 100A. Accordingly, the sensing area 100SA may provide an external natural light to the camera module CM. The sensing area 100SA may be a portion of the display area 100A, and thus, the image may be displayed through the sensing area 100SA.

A pixel PX may be located in the display area 100A. A light emitting element is located in the display area 100A, and the light emitting element is not located in the peripheral area 100N. The pixel PX may be located in each of the sensing area 100SA and the main display area. However, the pixel PX located in the sensing area 100SA and the pixel PX located in the main display area may have different structures from each other, and this will be described in more detail later.

Figure 3:
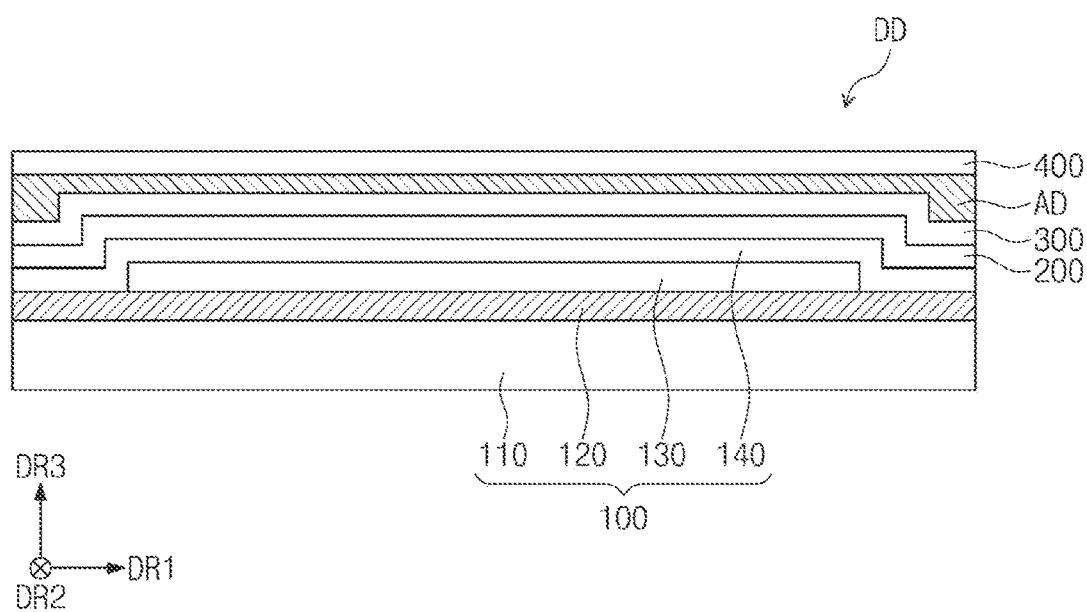
FIG. 3 is a cross-sectional view showing a display device according to some embodiments of the present disclosure.

FIG. 3 is a cross-sectional view showing the display device DD according to some embodiments of the present disclosure.

Referring to FIG. 3, the display device DD may include a display panel 100, a sensor layer 200, an anti-reflective layer 300, and a window 400. The anti-reflective layer 300 may be coupled with the window 400 by an adhesive layer AD.

The display panel 100 may have a configuration that substantially generates the images. The display panel 100 may be a light emitting type of display panel. For example, the display panel 100 may be an organic light emitting display panel, an inorganic light emitting display panel, a micro-LED display panel, or a nano-LED display panel. The display panel 100 may be referred to as a display layer.

The display panel 100 may include a base layer 110, a circuit layer 120, a light emitting element layer 130, and an encapsulation layer 140.

The base layer 110 may be a member that provides a base surface on which the circuit layer 120 is located. The base layer 110 may be a rigid substrate or a flexible substrate that is bendable, foldable, or rollable. The base layer 110 may be a glass substrate, a metal substrate, or a polymer substrate, however, embodiments according to the present disclosure are not limited thereto or thereby. According to some embodiments, the base layer 110 may be an inorganic layer, an organic layer, or a composite material layer.

The base layer 110 may have a multi-layer structure. For instance, the base layer 110 may include a first synthetic resin layer, an inorganic layer having a single-layer or multi-layer structure, and a second synthetic resin layer located on the inorganic layer having a single-layer or multi-layer structure. Each of the first and second synthetic resin layers may include a polyimide-based resin, however, it should not be particularly limited.

The circuit layer 120 may be located on the base layer 110. The circuit layer 120 may include an insulating layer, a semiconductor pattern, a conductive pattern, and a signal line.

The light emitting element layer 130 may be located on the circuit layer 120. The light emitting element layer 130 may include the light emitting element. For example, the light emitting element may include an organic light emitting material, an inorganic light emitting material, an organic-inorganic light emitting material, a quantum dot, a quantum rod, a micro-LED, or a nano-LED.

The encapsulation layer 140 may be located on the light emitting element layer 130. The encapsulation layer 140 may protect the light emitting element layer 130 from moisture, oxygen, and a foreign substance such as dust particles. The encapsulation layer 140 may include at least one inorganic layer. The encapsulation layer 140 may include a stack structure in which an inorganic layer, an organic layer, and an inorganic layer are sequentially stacked.

The sensor layer 200 may be located on the display panel 100. The sensor layer 200 may sense an external input applied thereto from the outside. For example, the external input may be a user input. The user input may include a variety of external inputs, such as a part of user's body, light, heat, pen, or pressure.

The sensor layer 200 may be formed on the display panel 100 through successive processes. In this case, the sensor layer 200 may be located directly on the display panel 100. In the present disclosure, the expression "the sensor layer 200 is located directly on the display panel 100" means that no intervening elements are present between the sensor layer 200 and the display panel 100. That is, a separate adhesive member may not be located between the sensor layer 200 and the display panel 100.

The anti-reflective layer 300 may be located directly on the sensor layer 200. The anti-reflective layer 300 may reduce a reflectance of the external light incident to the display device DD from the outside. The anti-reflective layer 300 may be formed on the sensor layer 200 through successive processes. The anti-reflective layer 300 may include color filters. The color filters may be arranged in an arrangement (e.g., a set or predetermined arrangement). The arrangement of the color filters may be determined by taking into account colors of lights emitted from pixels included in the display panel 100. In addition, the anti-reflective layer 300 may further include a black matrix adjacent to the color filters. The anti-reflective layer 300 will be described in detail later.

According to some embodiments, the sensor layer 200 may be omitted. In this case, the anti-reflective layer 300 may be located directly on the display panel 100. According to some embodiments, positions of the sensor layer 200 and the anti-reflective layer 300 may be changed with each other.

According to some embodiments, the display device DD may further include an optical layer located on the anti-reflective layer 300. As an example, the optical layer may be formed on the anti-reflective layer 300 through successive processes. The optical layer may control a direction of a light incident from the display panel 100 to improve a front luminance of the display device DD. As an example, the optical layer may include an organic insulating layer through which openings are defined to respectively correspond to light emitting areas of the pixels included in the display panel 100 and a high refractive index layer covering the organic insulating layer and filled in the openings. The high refractive index layer may have a refractive index higher than that of the organic insulating layer.

A window 400 may be formed or positioned on the optical layer 300 and the reflective layer 300. The window 400 may provide a front surface of the electronic device 1000. The window 400 may include a glass film or a synthetic resin film as its base film. The window 400 may further include an anti-reflective layer or an anti-fingerprint layer. The window 400 may include the glass film or the synthetic resin film. The window 400 may further include a bezel pattern BZ (refer to FIG. 5E) overlapping a peripheral area DP-NA (refer to FIG. 5A) of the display panel 100.

Figure 4:
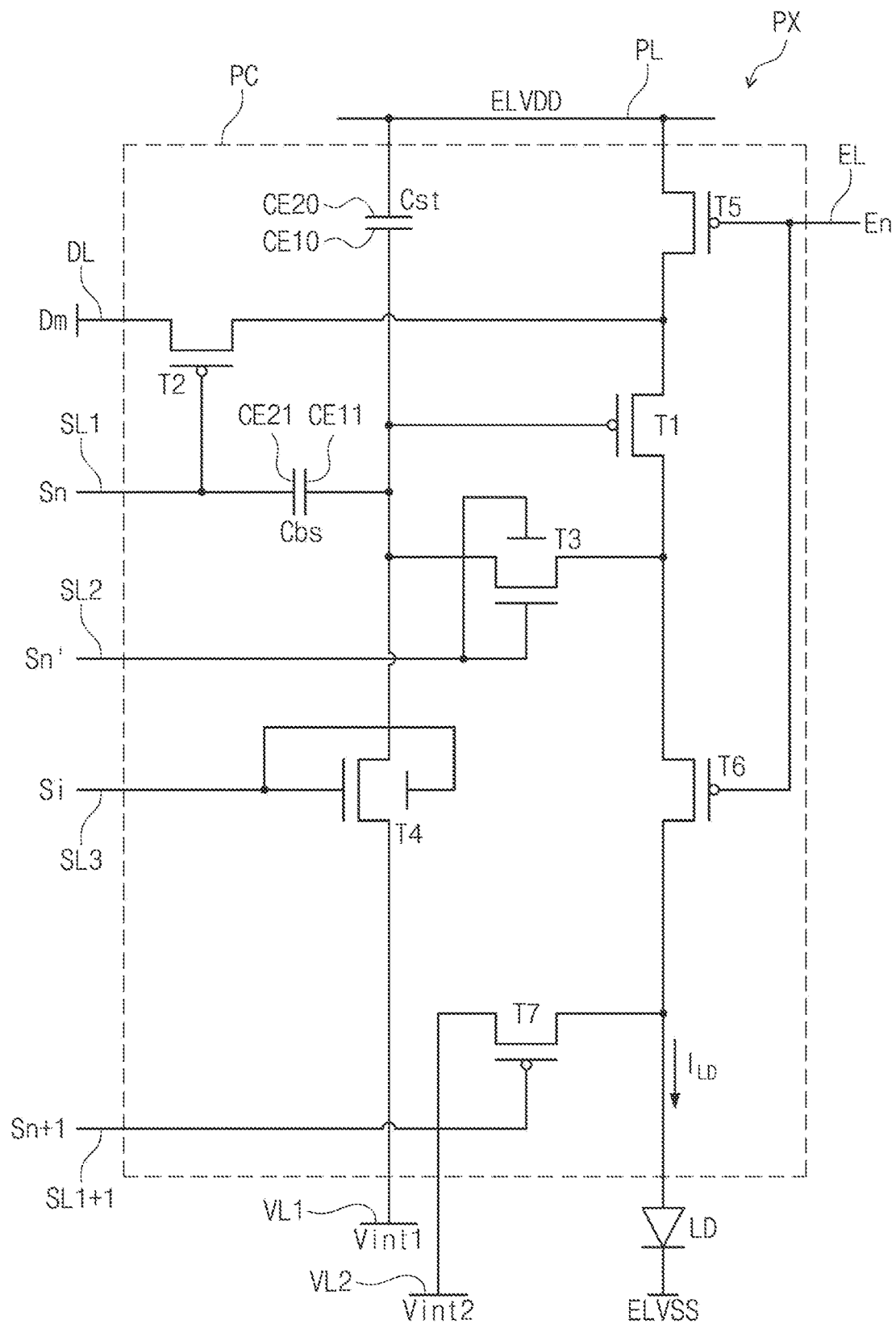
FIG. 4 is an equivalent circuit diagram showing a pixel according to some embodiments of the present disclosure.

FIG. 4 is an equivalent circuit diagram showing the pixel PX according to some embodiments of the present disclosure.

FIG. 4 shows an equivalent circuit diagram of one pixel PX among the pixels PX shown in FIG. 2. The pixel PX may include a light emitting element LD and a pixel circuit PC. The light emitting element LD may be a component included in the light emitting element layer 130 of FIG. 3, and the pixel circuit PC may be a component included in the circuit layer 120 of FIG. 3.

The pixel circuit PC may include a plurality of transistors (or thin film transistors) T1 to T7 and a storage capacitor Cst. The transistors T1 to T7 and the storage capacitor Cst may be electrically connected to signal lines SL1, SL2, SL3, SL1+1, EL, and DL, a first initialization voltage line VL1, a second initialization voltage line VL2 (or referred to as an anode initialization voltage line), and a driving voltage line PL.

The transistors T1 to T7 may include a driving transistor T1 (or referred to as a first transistor), a switching transistor T2 (or referred to as a second transistor), a compensation transistor T3 (or referred to as a third transistor), a first initialization transistor T4 (or referred to as a fourth transistor), an operation control transistor T5 (or referred to as a fifth transistor), an emission control transistor T6 (or referred to as a sixth transistor), and a second initialization transistor T7 (or referred to as a seventh transistor).

The light emitting element LD may include a first electrode, e.g., an anode electrode or a pixel electrode, and a second electrode, e.g., a cathode electrode or a common electrode. The first electrode of the light emitting element LD may be connected to the driving transistor T1 via the emission control transistor T6 to receive a driving current $I_{LD}$, and the second electrode may receive a low power voltage ELVSS. The light emitting element LD may generate a light having a luminance corresponding to the driving current $I_{LD}$.

Some transistors of the transistors T1 to T7 may be an n-channel MOSFET (NMOS), and the other transistors of the transistors T1 to T7 may be a p-channel MOSFET (PMOS). As an example, the compensation transistor T3 and the first initialization transistor T4 among the transistors T1 to T7 may be the n-channel MOSFET (NMOS), and the other transistors among the transistors T1 to T7 may be the p-channel MOSFET (PMOS).

According to some embodiments, among the transistors T1 to T7, the compensation transistor T3, the first initialization transistor T4, and the second initialization transistor T7 may be the NMOS, and the other transistors may be the PMOS. According to some embodiments, among the transistors T1 to T7, only one transistor may be the NMOS, and the other transistors may be the PMOS. According to some embodiments, all the transistors T1 to T7 may be the NMOS or the PMOS.

The signal lines may include a first present scan line SL1 transmitting a first scan signal Sn, a second present scan line SL2 transmitting a second scan signal Sn', a third scan line SL3 transmitting a third scan signal S1 to the first initialization transistor T4, an emission control line EL transmitting an emission control signal En to the operation control transistor T5 and the emission control transistor T6, a next scan line SL1+1 transmitting a next scan signal Sn+1 to the second initialization transistor T7, and a data line DL crossing the first present scan line SL1 and transmitting a data signal Dm. The first scan signal Sn may be a current scan signal, and the next scan signal Sn+1 may be a scan signal immediately following the first scan signal Sn.

The driving voltage line PL may transmit a driving voltage ELVDD to the driving transistor T1, and the first initialization voltage line VL1 may transmit an initialization voltage Vint1 to initialize the driving transistor T1 and the first electrode of the light emitting element LD.

A gate of the driving transistor T1 may be connected to the storage capacitor Cst, a source of the driving transistor T1 may be connected to the driving voltage line PL via the operation control transistor T5, and a drain of the driving transistor T1 may be electrically connected to the first electrode of the light emitting element LD via the emission control transistor T6. The driving transistor T1 may receive the data signal Dm in response to a switching operation of the switching transistor T2 and may supply the driving current $I_{LD}$ to the light emitting element LD.

A gate of the switching transistor T2 may be connected to the first present scan line SL1 transmitting the first scan signal Sn, a source of the switching transistor T2 may be connected to the data line DL, and a drain of the switching transistor T2 may be connected to the source of the driving transistor T1 and may be connected to the driving voltage line PL via the operation control transistor T5. The switching transistor T2 may be turned on in response to the first scan signal Sn provided through the first present scan line SL1 and may perform the switching operation to transmit the data signal Dm applied to the data line DL to the source of the driving transistor T1.

A gate of the compensation transistor T3 may be connected to the second present scan line SL2. A drain of the compensation transistor T3 may be connected to the drain of the driving transistor T1 and may be connected to the first electrode of the light emitting element LD via the emission control transistor T6. A source of the compensation transistor T3 may be connected to a first electrode CE10 of the storage capacitor Cst and the gate of the driving transistor T1. In addition, the source of the compensation transistor T3 may be connected to a drain of the first initialization transistor T4.

The compensation transistor T3 may be turned on in response to the second scan signal Sn' applied thereto via the second present scan line SL2 and may electrically connect the gate and the drain of the driving transistor T1 to allow the driving transistor T1 to be connected in a diode configuration.

A gate of the first initialization transistor T4 may be connected to the third scan line SL3. A source of the first initialization transistor T4 may be connected to a source of the second initialization transistor T7 and the first initialization voltage line VL1. The drain of the first initialization transistor T4 may be connected to the first electrode CE10 of the storage capacitor Cst, the source of the compensation transistor T3, and the gate of the driving transistor T1. The first initialization transistor T4 may be turned on in response to the third scan signal Si applied thereto through the third scan line SL3 and may transmit the initialization voltage Vint1 to the gate of the driving transistor T1 to perform an initialization operation that initializes a voltage of the gate of the driving transistor T1.

A gate of the operation control transistor T5 may be connected to the emission control line EL, a source of the operation control transistor T5 may be connected to the driving voltage line PL, and a drain of the operation control transistor T5 may be connected to the source of the driving transistor T1 and the drain of the switching transistor T2.

A gate of the emission control transistor T6 may be connected to the emission control line EL, a source of the emission control transistor T6 may be connected to the drain of the driving transistor T1 and the drain of the compensation transistor T3, and a drain of the emission control transistor T6 may be connected to a drain of the second initialization transistor T7 and the first electrode of the light emitting element LD.

The operation control transistor T5 and the emission control transistor T6 may be substantially simultaneously (or concurrently) turned on in response to the emission control signal En applied thereto via the emission control line EL, and the driving voltage ELVDD may be applied to the light emitting element LD to allow the driving current $I_{LD}$ to flow through the light emitting element LD.

A gate of the second initialization transistor T7 may be connected to the next scan line SL1+1, the drain of the second initialization transistor T7 may be connected to the drain of the emission control transistor T6 and the first electrode of the light emitting element LD, and the source of the second initialization transistor T7 may be connected to the second initialization voltage line VL2 to receive an anode initialization voltage Vint2. The second initialization transistor T7 may be turned on in response to the next scan signal Sn+1 applied thereto via the next scan line SL1+1 to initialize the first electrode of the light emitting element LD.

According to some embodiments, the second initialization transistor T7 may be connected to the emission control line EL and may be driven in response to the emission control signal En. Meanwhile, positions of the source and the drain may be changed with each other depending on the types, e.g., a p-type or an n-type, of the transistor.

The storage capacitor Cst may include the first electrode CE10 and a second electrode CE20. The first electrode CE10 of the storage capacitor Cst may be connected to the gate of the driving transistor T1, and the second electrode CE20 of the storage capacitor Cst may be connected to the driving voltage line PL. The storage capacitor Cst may be charged with electric charges corresponding to a difference between the voltage of the gate of the driving transistor T1 and the driving voltage ELVDD.

A boosting capacitor Cbs may include a first electrode CE11 and a second electrode CE21. The first electrode CE11 of the boosting capacitor Cbs may be connected to the first electrode CE10 of the storage capacitor Cst, and the second electrode CE21 of the boosting capacitor Cbs may receive the first scan signal Sn. The boosting capacitor Cbs may boost the voltage of the gate of the driving transistor T1 at a time point at which the provision of the first scan signal Sn is stopped, and thus a voltage drop of the gate may be compensated for.

Detailed operations of each pixel PX according to some embodiments are as follows.

When the third scan signal Si is provided via the third scan line SL3 during an initialization period, the first initialization transistor T4 may be turned on in response to the prior scan signal Sn−1, and the driving transistor T1 may be initialized by the initialization voltage Vint1 provided from the first initialization voltage line VL1.

When the first scan signal Sn and the second scan signal Sn' are provided via the first present scan line SL1 and the second present scan line SL2 during a data programming period, the switching transistor T2 and the compensation transistor T3 may be turned on in response to the first scan signal Sn and the second scan signal Sn'. In this case, the driving transistor T1 may be connected in a diode configuration by the turned-on compensation transistor T3 and may be forward biased.

Then, a compensation voltage Dm+Vth (Vth is a negative (−) value), which is obtained by subtracting a threshold voltage Vth of the driving transistor T1 from the data signal Dm provided from the data line DL, may be applied to the gate of the driving transistor T1.

The driving voltage ELVDD and the compensation voltage Dm+Vth may be respectively applied to both ends of the storage capacitor Cst, and the storage capacitor Cst may be charged with electric charges corresponding to a difference in voltage between the both ends thereof.

During a light emitting period, the operation control transistor T5 and the emission control transistor T6 may be turned on by the emission control signal En provided from the emission control line EL. The driving current $I_{LD}$ according to the difference between the voltage of the gate of the driving transistor T1 and the driving voltage ELVDD may be generated, and the driving current $I_{LD}$ may be supplied to the light emitting element LD via the emission control transistor T6.

According to some embodiments, at least one transistor of the transistors T1 to T7 may include a semiconductor layer containing oxide, and the other transistors of the transistors T1 to T7 may include a semiconductor layer containing silicon.

For example, the driving transistor T1, which directly affects the luminance of the display device, may include the semiconductor layer containing polycrystalline silicon with high reliability, and thus, the display device with high resolution may be implemented.

Meanwhile, because an oxide semiconductor has a relatively high carrier mobility and a relatively low leakage current, the voltage drop is not large even though the driving time may be relatively long. That is, even when the pixels PX are driven at a relatively low frequency, a change in color of the image due to the voltage drop may not be large, and thus, the pixels PX may be driven at a relatively low frequency.

As described above, because the oxide semiconductor has a relatively low leakage current, at least one of the compensation transistor T3, the first initialization transistor T4, or the second initialization transistor T7, which are connected to the gate of the driving transistor T1, may include the oxide semiconductor. Thus, leakage current flowing to the gate of the driving transistor T1 may prevented or reduced, and overall power consumption may be reduced.

Although various circuit components are illustrated in the pixel PX described above in FIG. 4, embodiments according to the present disclosure are not limited to the circuit configuration illustrated. For example, some embodiments may include additional components or fewer components without departing from the spirit and scope of embodiments according to the present disclosure.

Figure 5A:
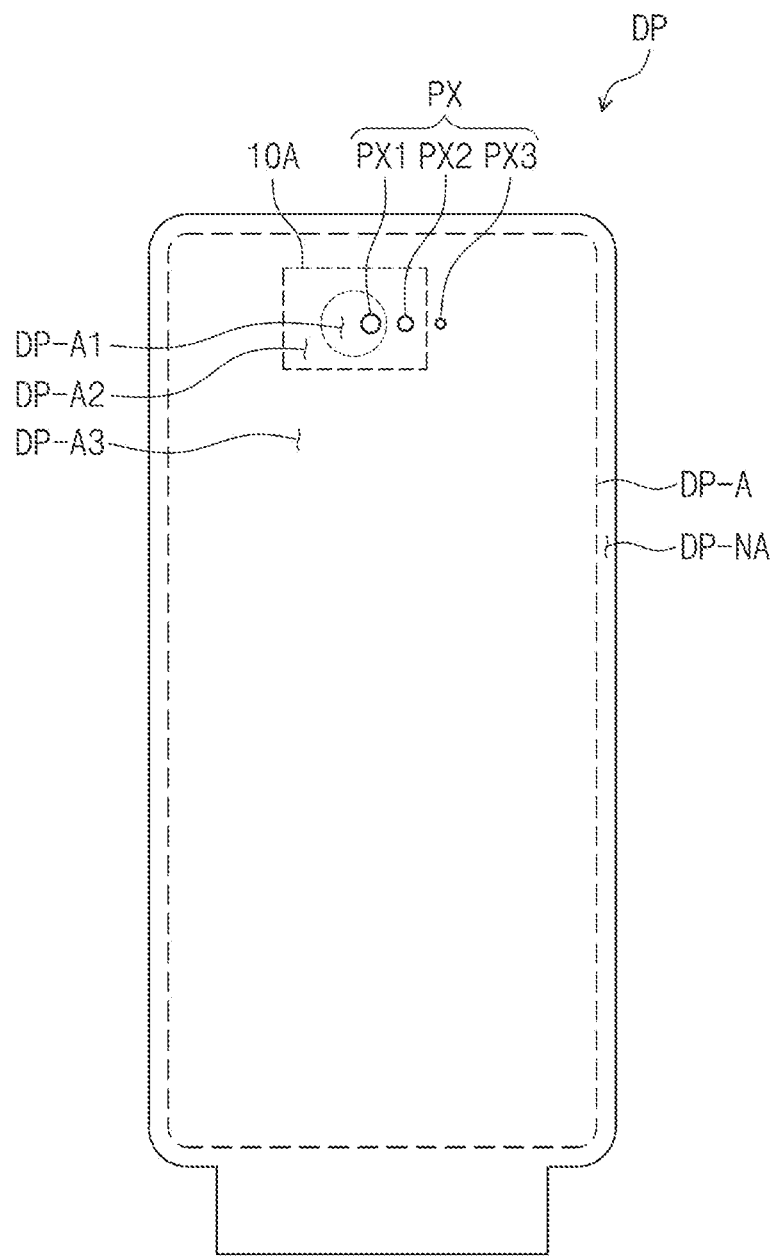
FIG. 5A is a plan view showing a display panel according to some embodiments of the present disclosure.
Figure 5B:
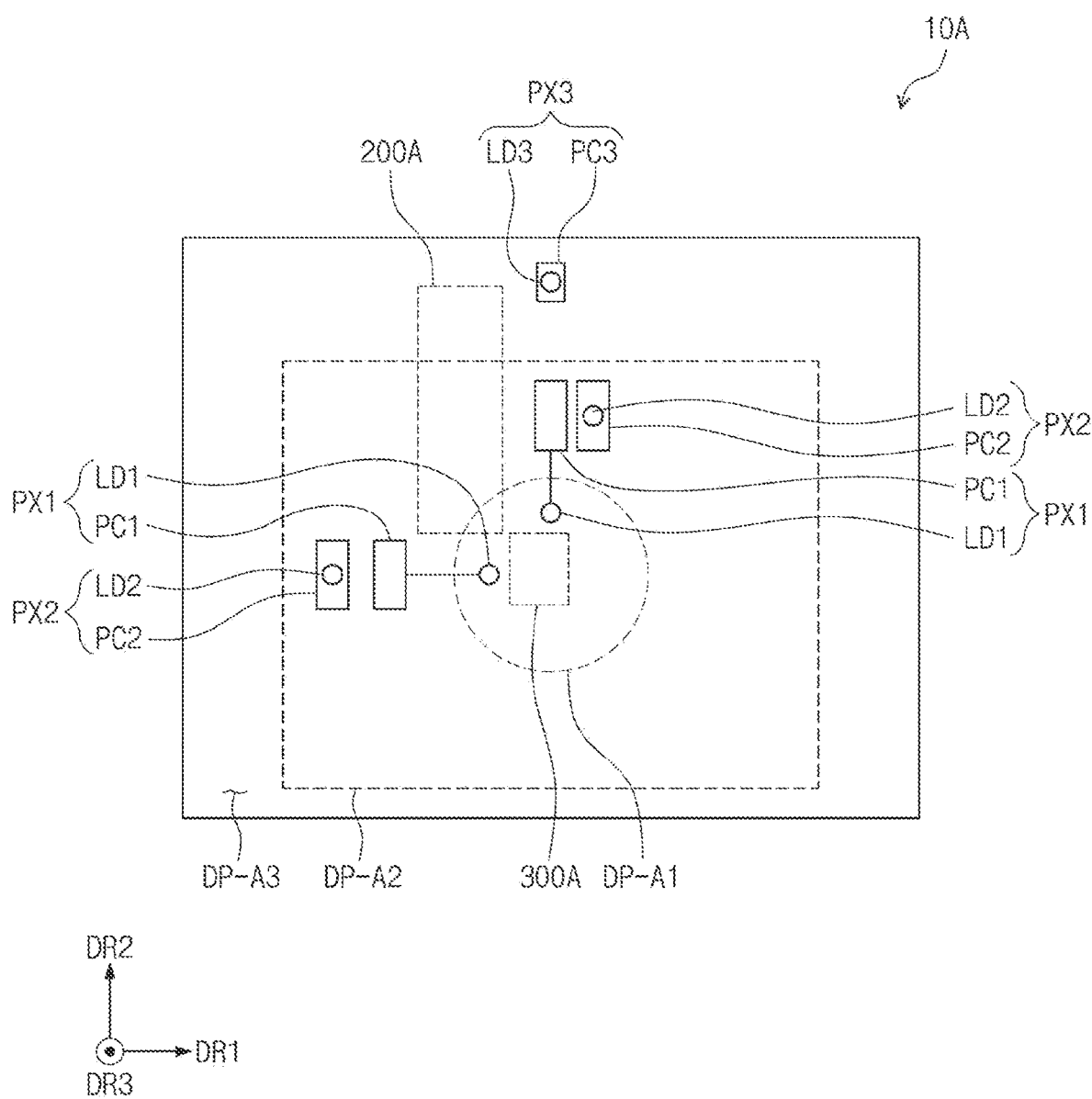
FIG. 5B is an enlarged plan view showing a portion of the display panel of FIG. 5A.
Figure 5C:
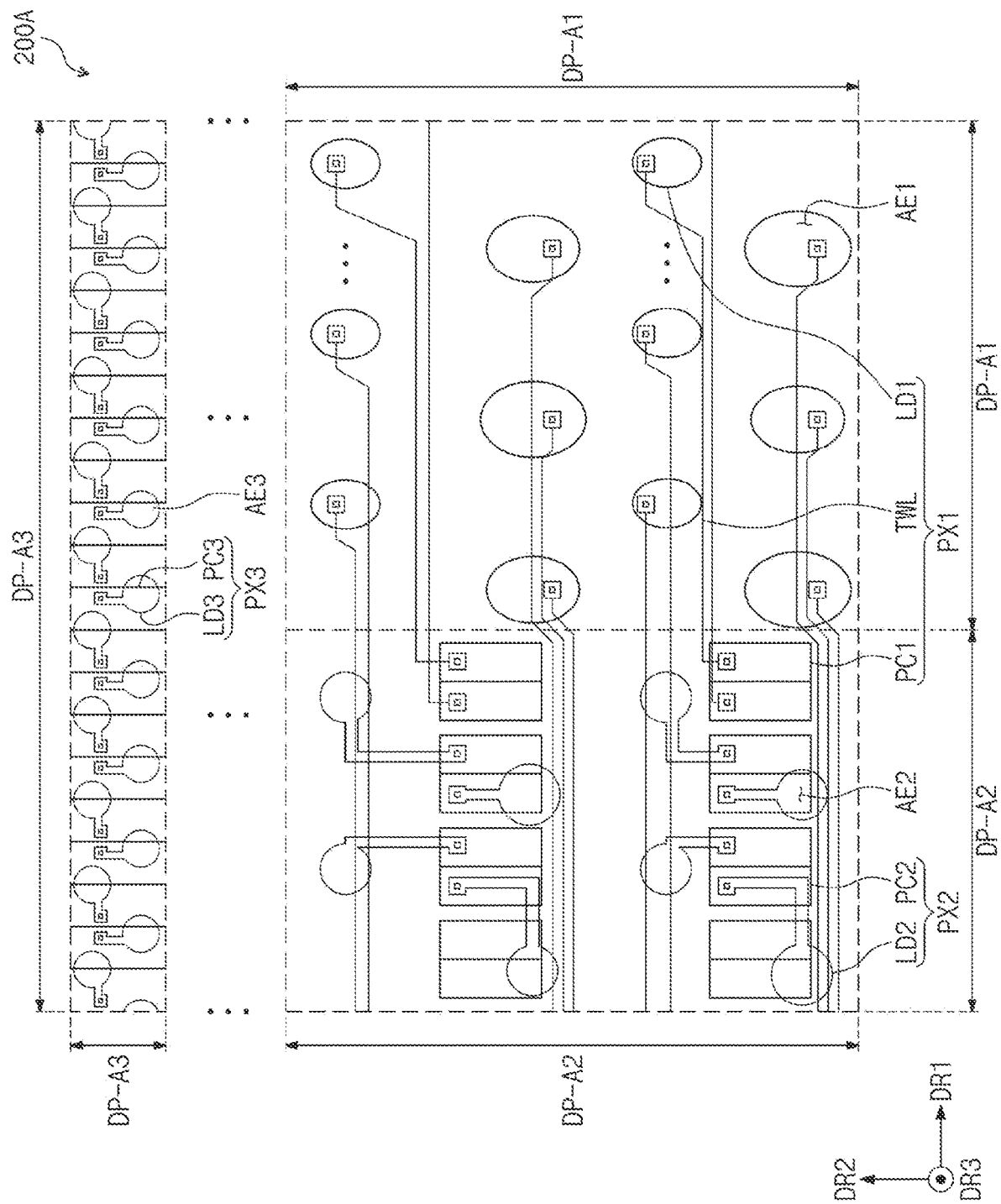
FIG. 5C is an enlarged plan view showing a portion of the display panel of FIG. 5B.
Figure 5D:
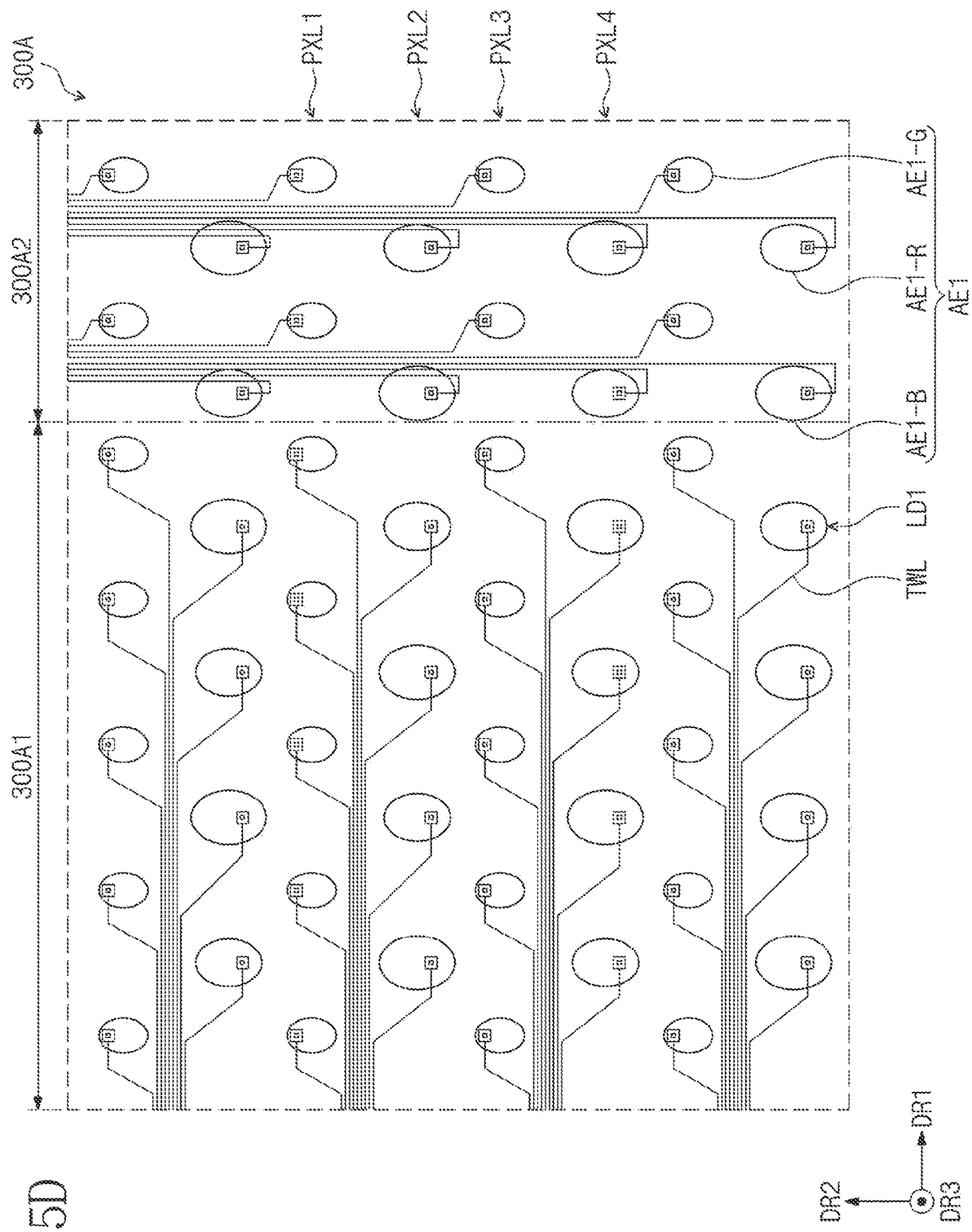
FIG. 5D is an enlarged plan view showing a portion of the display panel of FIG. 5B.
Figure 5E:
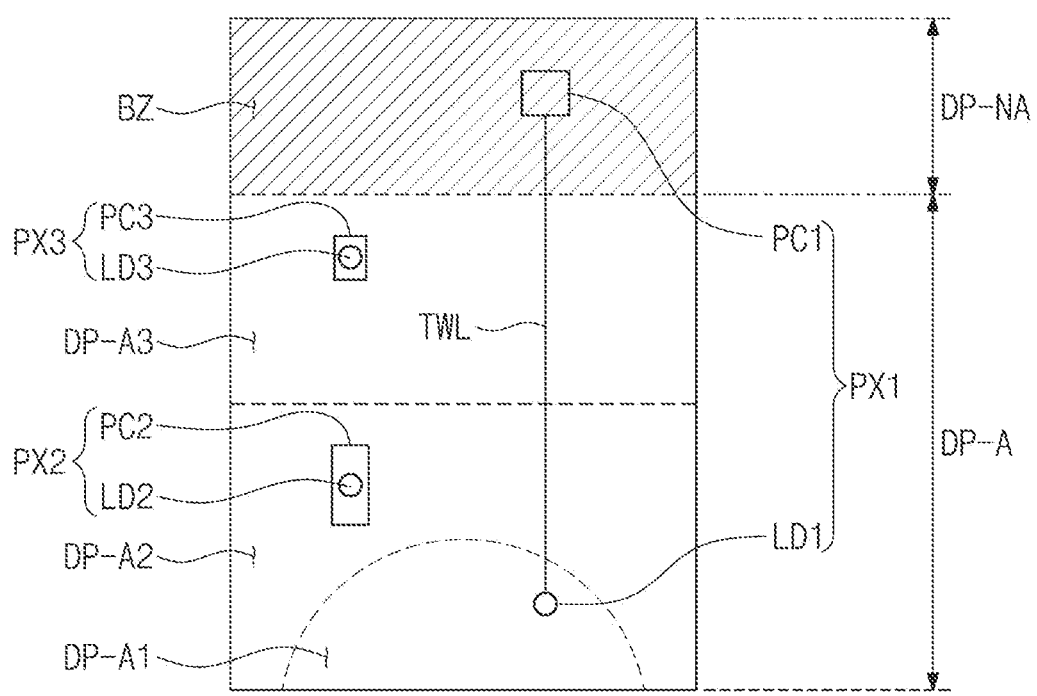
FIG. 5E is a plan view showing a display panel according to some embodiments of the present disclosure.
Figure 5E:
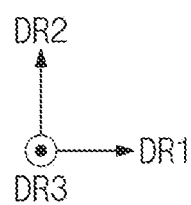

FIG. 5A is a plan view showing the display panel DP according to some embodiments of the present disclosure. FIG. 5B is an enlarged plan view showing a portion 10A of the display panel DP of FIG. 5A. FIG. 5C is an enlarged plan view showing a portion 200A of the display panel DP of FIG. 5B. FIG. 5D is an enlarged plan view showing a portion 300A of the display panel DP of FIG. 5B. FIG. 5E is a plan view showing a display panel DP according to some embodiments of the present disclosure.

Referring to FIG. 5A, the display panel 100 may include a display area DP-A and the peripheral area DP-NA. The peripheral area DP-NA may be defined adjacent to the display area DP-A and may surround at least a portion of the display area DP-A.

The display area DP-A may include a first area DP-A1, a second area DP-A2, and a third area DP-A3. The first area DP-A1 may overlap or correspond to the sensing area 1000SA shown in FIG. 1 or the sensing area 100SA shown in FIG. 2. According to some embodiments, the first area DP-A1 is shown as a circular shape, however, the shape of the first area DP-A1 should not be limited thereto or thereby. The first area DP-A1 may have a variety of shapes, such as a polygonal shape, an oval shape, a figure having at least one curved side, an irregular shape, or any suitable shape according to the design of the display panel 100.

The display panel 100 may include a plurality of pixels PX. The display panel 100 may include a first pixel PX1 including a light emitting element located in the first area DP-A1, a second pixel PX2 including a light emitting element located in the second area DP-A2, and a third pixel PX3 including a light emitting element located in the third area DP-A3. Each of the first pixel PX1, the second pixel PX2, and the third pixel PX3 may include the pixel circuit PC shown in FIG. 4. The first pixel PX1, the second pixel PX2, and the third pixel PX3, which are shown in FIG. 5A, are illustrated with respect to positions of corresponding light emitting elements LD (refer to FIG. 4).

Each of the first pixel PX1, the second pixel PX2, and the third pixel PX3 may be provided in plural. In this case, each of the first, second, and third pixels PX1, PX2, and PX3 may include a red pixel, a green pixel, and a blue pixel and may further include a white pixel according to some embodiments.

The first area DP-A1, the second area DP-A2, and the third area DP-A3 may be distinguished from each other by a light transmittance or a resolution. The light transmittance and the resolution may be measured based on a unit area.

The first area DP-A1 may have a light transmittance higher than that of the second area DP-A2 and the third area DP-A3. This is because a ratio of an area occupied by a light blocking structure, which is described in more detail later, to an entire area is lower in the first area DP-A1 than in the second area DP-A2 and the third area DP-A3. An area where the light blocking structure is not located may correspond to a transmission area through which the optical signal passes. The light blocking structure may include a conductive pattern of the circuit layer, a pixel definition layer, and a pixel definition pattern described later.

The third area DP-A3 may have a resolution higher than that of the first area DP-A1 and the second area DP-A2. The number of light emitting elements located in the unit area (or in an area of the same size) may be larger in the third area DP-A3 than in the first area DP-A1 and the second area DP-A2.

When distinguishing based on the light transmittance, the first area DP-A1 may be a first transmittance area, and the second area DP-A2 and the third area DP-A3 may correspond to different portions of a second transmittance area, which is distinguished from the first transmittance area. The second area DP-A2 may have substantially the same transmittance as that of the third area DP-A3. Although the transmittance of the second area DP-A2 is not the same as the transmittance of the third area DP-A3, when the first area DP-A1 is defined as the first transmittance area, the second area DP-A2 and the third area DP-A3 may be defined as the second transmittance area because the transmittance of the first area DP-A1 is significantly higher than the transmittance of each of the second area DP-A2 and the third area DP-A3.

When distinguishing based on the resolution, the first area DP-A1 and the second area DP-A2 may correspond to different portions of a first resolution area, and the third area DP-A3 may be a second resolution area, which is distinguished from the first resolution area. The number of light emitting elements of the first area DP-A1 per the unit area may be substantially the same as the number of light emitting elements of the second area DP-A2 per the unit area.

Referring to FIG. 5B, the first pixel PX1 may include a first light emitting element LD1 and a first pixel circuit PC1 electrically connected to the first light emitting element LD1. The second pixel PX2 may include a second light emitting element LD2 and a second pixel circuit PC2 to drive the second light emitting element LD2, and the third pixel PX3 may include a third light emitting element LD3 and a third pixel circuit PC3 to drive the third light emitting element LD3.

The first light emitting element LD1 may be located in the first area DP-A1, and the first pixel circuit PC1 may be located in the second area DP-A2. The second light emitting element LD2 and the second pixel circuit PC2 may be located in the second area DP-A2. The third light emitting element LD3 and the third pixel circuit PC3 may be located in the third area DP-A3.

The first pixel circuit PC1 may be located not in the first area DP-A1 but in the second area DP-A2 to improve the transmittance of the first area DP-A1. The occupancy of the transmission area may increase by removing the light blocking structure such as the transistor from the first area DP-A1, and as a result, the transmittance of the first area DP-A1 may be improved. The first pixel circuit PC1 may be located not in the second area DP-A2 but in the peripheral area DP-NA.

FIG. 5B shows two types of first pixels PX1 as a representative example. One first pixel PX1 may include the first light emitting element LD1 spaced apart from the first pixel circuit PC1 in the first direction DR1. The other first pixel PX1 may include the first light emitting element LD1 spaced apart from the first pixel circuit PC1 in the second direction DR2. According to some embodiments, the first pixel PX1 located at a right side of the first area DP-A1 may have an arrangement relation between the first light emitting element LD1 and the first pixel circuit PC1, which is similar to that between the first light emitting element LD1 and the first pixel circuit PC1 of the first pixel PX1 located at a left side of the first area DP-A1. In addition, the first pixel PX1 located at a lower side of the first area DP-A1 may have an arrangement relation between the first light emitting element LD1 and the first pixel circuit PC1, which is similar to that between the first light emitting element LD1 and the first pixel circuit PC1 of the first pixel PX1 located at an upper side of the first area DP-A1.

In FIG. 5C, first electrodes AE1, AE2, and AE3 of the light emitting elements are shown as a representative of the first light emitting elements LD1, the second light emitting elements LD2, and the third light emitting elements LD3. The number of the first light emitting elements LD1 per the unit area is smaller than the number of the third light emitting element LD3 per the unit area to improve the transmittance of the first area DP-A1. As an example, the resolution of the first area DP-A1 may be about ½, ⅜, ⅓, ¼, 2/9, ⅛, 1/9, or 1/16 of the resolution of the third area DP-A3. For example, the resolution of the third area DP-A3 may be equal to or greater than about 400 ppi, and the resolution of the first area DP-A1 may be about 200 ppi or about 100 ppi. However, this is merely one example and embodiments according to the present disclosure are not limited thereto or thereby. However, the first electrode AE1 of the first light emitting element LD1 may have an area greater than an area of the first electrode AE3 of the third light emitting element LD3.

An area in which the first light emitting element LD1 is not located in the first area DP-A1 may be defined as a transmission area. As an example, an area in which the first electrode AE1 of the first light emitting element LD1 is not located in the first area DP-A1 may be defined as the transmission area.

The number of the second light emitting elements LD2 may be smaller than the number of the third light emitting elements LD3 based on the unit area to secure an area where the first pixel circuit PC1 is arranged in the second area DP-A2. In the second area DP-A2, the first pixel circuit PC1 may be located in an area where the second pixel circuit PC2 is not located.

The first light emitting element LD1 may be electrically connected to the first pixel circuit PC1 via a connection line TWL. The connection line TWL may overlap the first area DP-A1 and the second area DP-A2. The connection line TWL may overlap a transmission area TA (refer to FIG. 9). At least a portion of the connection line TWL may include a transparent conductive material. In the first area DP-A1 of FIG. 5C, an area in which the first electrode AE1 is not located may be the transmission area TA. The transmission area TA will be described in more detail with reference to FIG. 9.

The first electrodes AE1, AE2, and AE3 may include a curved edge. The first electrodes AE1, AE2, and AE3 having the curved edge may reduce a diffraction of a light. In particular, the first electrode AE1 of the first light emitting element LD1 may minimize a diffraction of a light passing through the transmission area TA.

The first electrode AE1 of the first light emitting element LD1 may have an oval shape in a plane. The first electrode AE1 may secure a light emitting area and substantially simultaneously (or concurrently) may secure a connection area of the connection line TWL.

FIG. 5D shows the first light emitting elements LD1 having three colors. A first electrode AE1-R, a first electrode AE1-G, and a first electrode AE1-B are illustrated as a representative of a first light emitting element LD1 having a first color, a first light emitting element LD1 having a second color, and a first light emitting element LD1 having a third color, respectively. The first color may be a red color, the second color may be a green color, and the third color may be a blue color, however, they should not be limited thereto or thereby. According to some embodiments, the first, second, and third colors may be the other three primary colors.

First, second, third, and fourth light emitting element rows PXL1, PXL2, PXL3, and PXL4 located in the first area DP-A1 are shown in FIG. 5D. The first electrodes AE1-G having the second color may be arranged in each of the first and third light emitting element rows PXL1 and PXL3 along the first direction DR1. The first electrodes AE1-R having the first color and the first electrodes AE1-B having the third color may be alternately arranged with each other in each of the second and fourth light emitting element rows PXL2 and PXL4 along the first direction DR1. In the second direction DR2, the first electrode AE1-R having the first color and arranged in the second light emitting element row PXL2 may be aligned with the first electrode AE1-B having the third color and arranged in the fourth light emitting element row PXL4. This arrangement of the first to fourth light emitting element rows PXL1 to PXL4 may be applied to the second area DP-A2 and the third area DP-A3.

The first electrodes AE1-R, AE1-G, and AE1-B located in an area 300A1 may correspond to the first electrodes of the first pixels PX1 located at the left side of the first area DP-A1 shown in FIG. 5B, and the first electrodes AE1-R, AE1-G, and AE1-B located in the other area 300A2 may correspond to the first electrodes of the first pixels PX1 located at the upper side of the first area DP-A1 shown in FIG. 5B. The extension direction of the connection line TWL may be different depending on the positions of the first electrodes AE1-R, AE1-G, and AE1-B.

Referring to FIG. 5E, the first pixel circuit PC1 may be located in a fourth area rather than the first area DP-A1, the second area DP-A2, and the third area DP-A3. As shown in FIG. 5E, the first pixel circuit PC1 may be located in the peripheral area DP-NA. The connection line TWL may overlap the first area DP-A1, the second area DP-A2, the third area DP-A3, and the peripheral area DP-NA.

Figure 6A:
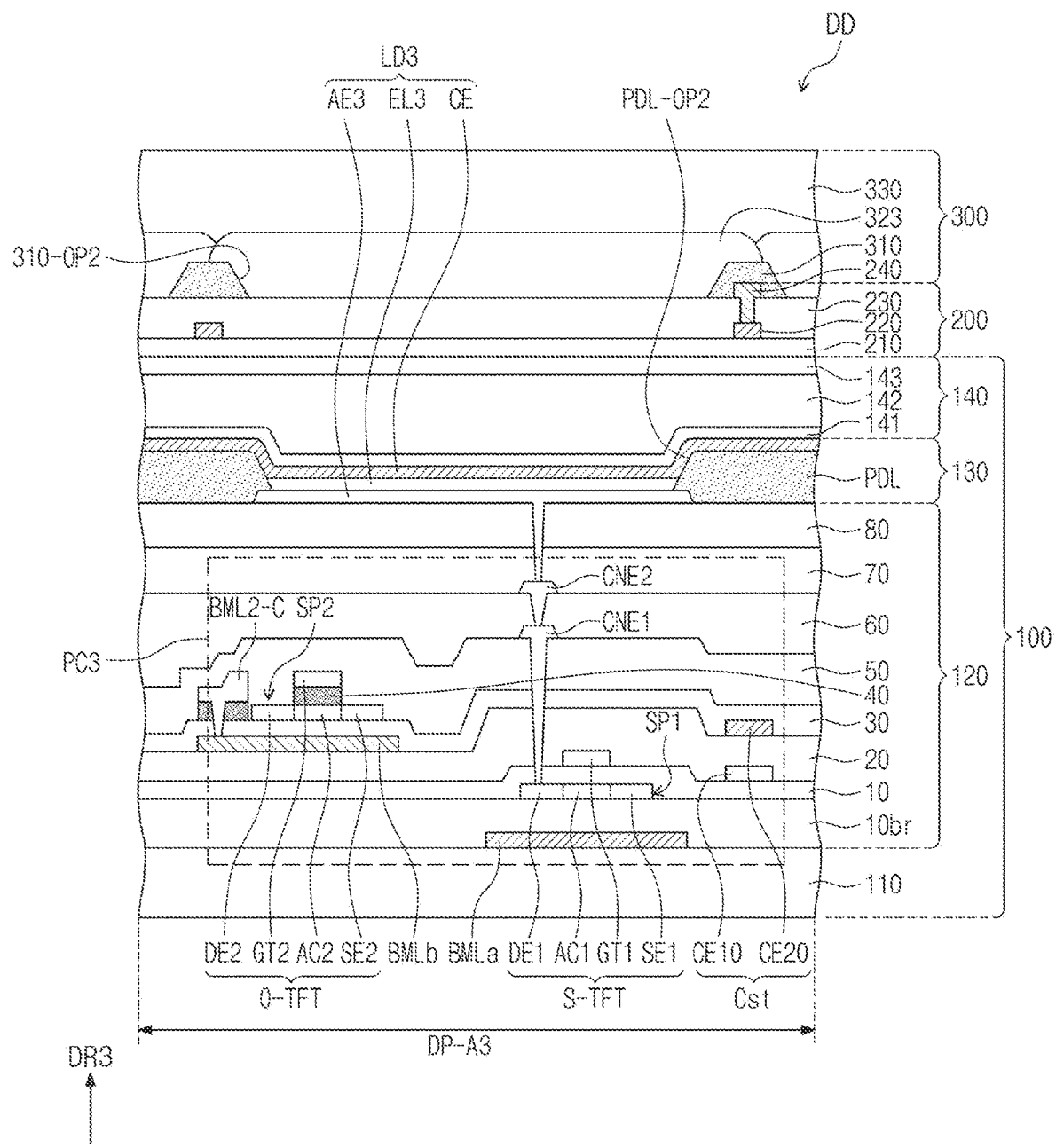
FIGS. 6A and 6B are cross-sectional views showing a third area of a display device according to some embodiments of the present disclosure.
Figure 6B:
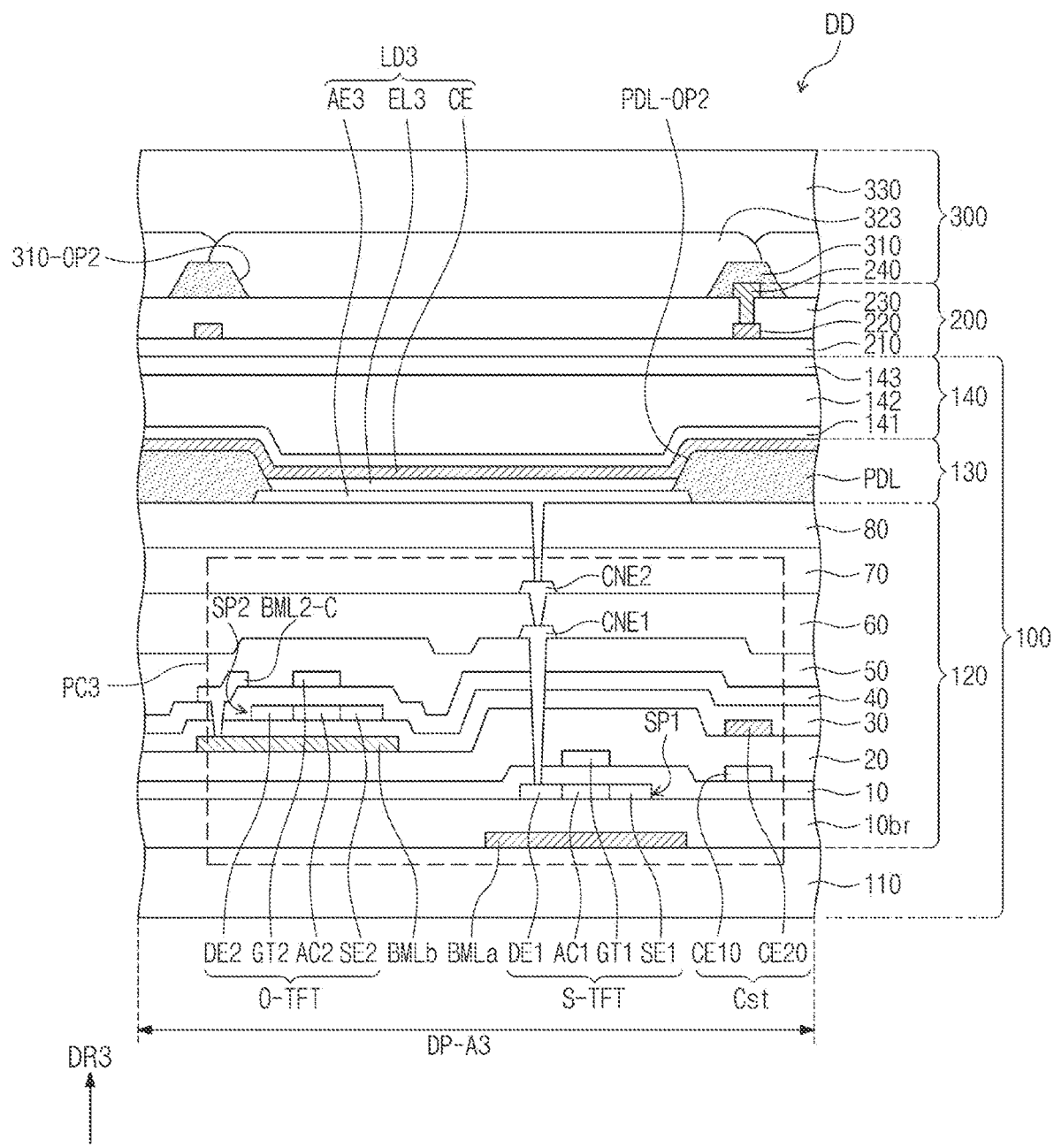
Figure 7:
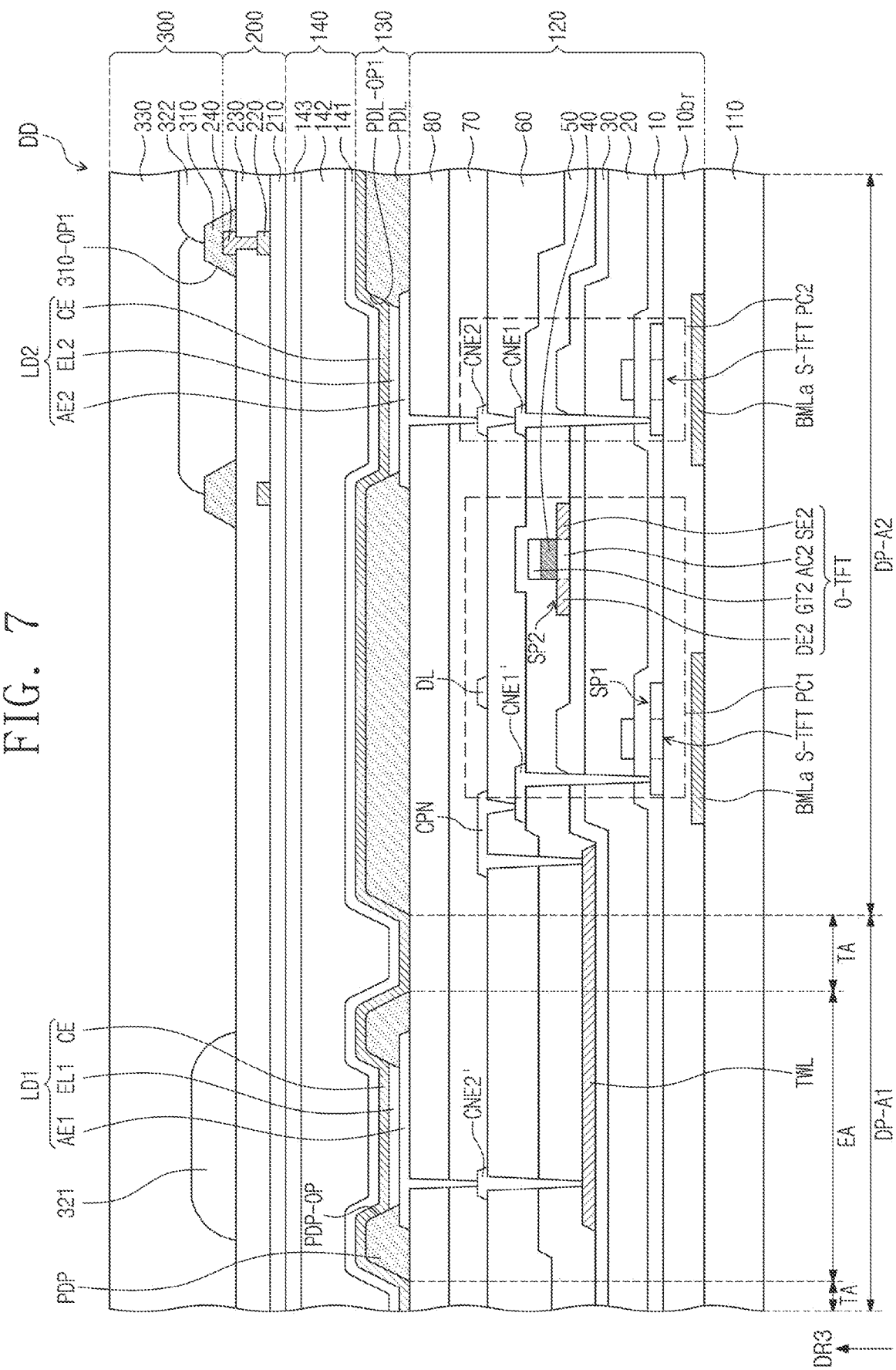
FIG. 7 is a cross-sectional view showing a first area and a second area of a display device according to some embodiments of the present disclosure.

FIGS. 6A and 6B are cross-sectional views showing the third area DP-A3 of the display device DD according to some embodiments of the present disclosure. FIG. 7 is a cross-sectional view showing the first area DP-A1 and the second area DP-A2 of the display device DD according to some embodiments of the present disclosure.

FIGS. 6A and 6B show the third light emitting element LD3 and a silicon transistor S-TFT and an oxide transistor O-TFT of the third pixel circuit PC3 (refer to FIG. 5C). In the equivalent circuit shown in FIG. 4, the third and fourth transistors T3 and T4 may be the oxide transistor O-TFT, and the other transistors may be the silicon transistor S-TFT. FIG. 7 shows the first light emitting element LD1, a portion of the first pixel circuit PC1, the second light emitting element LD2, and a portion of the second pixel circuit PC2. The silicon transistor S-TFT shown in FIG. 7 may be the sixth transistor T6 shown in FIG. 4.

A buffer layer 10*br* may be located on the base layer 110. The buffer layer 10*br* may prevent or reduce instances of metal atoms or impurities being diffused upward to a first semiconductor pattern SP1 from the base layer 110. The first semiconductor pattern SP1 may include an active area AC1 of the silicon transistor S-TFT. The buffer layer 10*br* may control a rate of heat supply during a crystallization process to form the first semiconductor pattern SP1 so that the first semiconductor pattern SP1 may be uniformly formed.

A first rear surface metal layer BMLa may be located under the silicon transistor S-TFT, and a second rear surface metal layer BMLb may be located under the oxide transistor O-TFT. The first and second rear surface metal layers BMLa and BMLb may be arranged to overlap the first, second, and third pixel circuits PC1, PC2, and PC3. The first and second rear surface metal layers BMLa and BMLb may prevent or reduce external light from reaching the first, second, and third pixel circuits PC1, PC2, and PC3.

The first rear surface metal layer BMLa may be arranged to correspond to at least a portion of each of the first, second, and third pixel circuits PC1, PC2, and PC3 (refer to FIG. 5C). The first rear surface metal layer BMLa may be arranged to overlap the driving transistor T1 (refer to FIG. 4) implemented by the silicon transistor S-TFT.

The first rear surface metal layer BMLa may be located between the base layer 110 and the buffer layer 10*br*. According to some embodiments, an inorganic barrier layer may be further located between the first rear surface metal layer BMLa and the buffer layer 10*br*. The first rear surface metal layer BMLa may be connected to an electrode or a wire and may receive a constant voltage or a signal from the electrode or wire. According to some embodiments, the first rear surface metal layer BMLa may be a floating electrode that is isolated from other electrodes or wire.

The second rear surface metal layer BMLb may be located under the oxide transistor O-TFT. The second rear surface metal layer BMLb may be located between a second insulating layer 20 and a third insulating layer 30. The second rear surface metal layer BMLb may be located on the same layer as the second electrode CE20 of the storage capacitor Cst. The second rear surface metal layer BMLb may be connected to a contact electrode BML2-C to receive a constant voltage or a signal. The contact electrode BML2-C may be located on the same layer as a gate GT2 of the oxide transistor O-TFT.

Each of the first rear surface metal layer BMLa and the second rear surface metal layer BMLb may include a reflective metal. As an example, each of the first rear surface metal layer BMLa and the second rear surface metal layer BMLb may include silver (Ag), an alloy including silver (Ag), molybdenum (Mo), an alloy including molybdenum (Mo), aluminum (Al), an alloy including aluminum (Al), aluminum nitride (AlN), tungsten (W), tungsten nitride (WN), copper (Cu), p+ doped amorphous silicon, or the like. The first rear surface metal layer BMLa and the second rear surface metal layer BMLb may include the same material or may include different materials.

According to some embodiments, the second rear surface metal layer BMLb may be omitted. The first rear surface metal layer BMLa may extend and may be located under the oxide transistor O-TFT, and the first rear surface metal layer BMLa may prevent or reduce the light incident to a lower portion of the oxide transistor O-TFT.

The first semiconductor pattern SP1 may be located on the buffer layer 10br. The first semiconductor pattern SP1 may include a silicon semiconductor. As an example, the silicon semiconductor may include amorphous silicon or polycrystalline silicon. For example, the first semiconductor pattern SP1 may include low temperature polycrystalline silicon.

FIGS. 6A and 6B show only a portion of the first semiconductor pattern SP1 located on the buffer layer 10br, and the first semiconductor pattern SP1 may be further located in other areas. The first semiconductor pattern SP1 may be arranged with a specific rule over the pixels. The first semiconductor pattern SP1 may have different electrical properties depending on whether it is doped or not or whether it is doped with an N-type dopant or a P-type dopant. The first semiconductor pattern SP1 may include a first region having a relatively high conductivity and a second region having a relatively low conductivity. The first region may be doped with the N-type dopant or the P-type dopant. A P-type transistor may include a region doped with the P-type dopant, and an N-type transistor may include a region doped with the N-type dopant. The second region may be a non-doped region or a region doped at a concentration lower than that of the first region.

The first region may have a conductivity greater than that of the second region and may substantially serve as an electrode or signal line. The second region may substantially correspond to an active area (or a channel) of the transistor. In other words, a portion of the first semiconductor pattern SP1 may be the active area of the transistor, another portion of the first semiconductor pattern SP1 may be a source or a drain of the transistor, and the other portion of the first semiconductor pattern SP1 may be a connection electrode or a connection signal line.

A source area SE1 (or a source), an active area AC1 (or a channel), and a drain area DE1 (or a drain) of the silicon transistor S-TFT may be formed from the first semiconductor pattern SP1. The source area SE1 and the drain area DE1 may extend in opposite directions to each other from the active area AC1 in a cross-section.

A first insulating layer 10 may be located on the buffer layer 10br. The first insulating layer 10 may commonly overlap the pixels and may cover the first semiconductor pattern SP1. The first insulating layer 10 may be an inorganic layer and/or an organic layer and may have a single-layer or multi-layer structure. The first insulating layer 10 may include at least one of aluminum oxide, titanium oxide, silicon oxide, silicon nitride, silicon oxynitride, zirconium oxide, or hafnium oxide. According to some embodiments, the first insulating layer 10 may have a single-layer structure of a silicon oxide layer. Not only the first insulating layer 10, but also an insulating layer of the circuit layer 120 described later may be an inorganic layer and/or an organic layer and may have a single-layer or multi-layer structure. The inorganic layer may include at least one of the above-mentioned materials, however, embodiments according to the present disclosure are not limited thereto or thereby.

A gate GT1 of the silicon transistor S-TFT may be located on the first insulating layer 10. The gate GT1 may be a portion of a metal pattern. The gate GT1 may overlap the active area AC1. The gate GT1 may be used as a mask in a process of doping the first semiconductor pattern SP1. The gate GT1 may include titanium (Ti), silver (Ag), an alloy including silver (Ag), molybdenum (Mo), an alloy including molybdenum (Mo), aluminum (Al), an alloy including aluminum (Al), aluminum nitride (AlN), tungsten (W), tungsten nitride (WN), copper (Cu), indium tin oxide (ITO), indium zinc oxide (IZO), or the like, however, embodiments according to the present disclosure are not particularly limited.

The second insulating layer 20 may be located on the first insulating layer 10 and may cover the gate GT1. The third insulating layer 30 may be located on the second insulating layer 20. The second electrode CE20 of the storage capacitor Cst may be located between the second insulating layer 20 and the third insulating layer 30. In addition, the first electrode CE10 of the storage capacitor Cst may be located between the first insulating layer 10 and the second insulating layer 20.

A second semiconductor pattern SP2 may be located on the third insulating layer 30. The second semiconductor pattern SP2 may include an active area AC2 of the oxide transistor O-TFT described later. The second semiconductor pattern SP2 may include an oxide semiconductor. The second semiconductor pattern SP2 may include a transparent conductive oxide (TCO), such as indium tin oxide (ITO), indium zinc oxide (IZO), indium gallium zinc oxide (IGZO), zinc oxide (ZnO), or indium oxide ($In_2O_3$).

The oxide semiconductor may include a plurality of areas distinguished from each other depending on whether a metal oxide is reduced. The area (hereinafter, referred to as a "reduced area") in which the metal oxide is reduced has a conductivity greater than that of the area (hereinafter, referred to as a "non-reduced area") in which the metal oxide is not reduced. The reduced area may substantially act as the source/drain of the transistor or the signal line. The non-reduced area may substantially correspond to the semiconductor area (or the active area or the channel) of the transistor. In other words, a portion of the second semiconductor pattern SP2 may be the semiconductor area of the transistor, another portion of the second semiconductor pattern SP2 may be the source area/drain area of the transistor, and the other portion of the second semiconductor pattern SP2 may be a signal transmission area.

A source area SE2 (or a source), an active area AC2 (or a channel), and a drain area DE2 (or a drain) of the oxide transistor O-TFT may be formed from the second semiconductor pattern SP2. The source area SE2 and the drain area DE2 may extend in opposite directions to each other from the active area AC2 in a cross-section.

A fourth insulating layer 40 may be located on the third insulating layer 30. As shown in FIG. 6A, the fourth insulating layer 40 may be an insulating pattern that overlaps the GT2 of the oxide transistor O-TFT and exposes the source area SE2 and the drain area DE2 of the oxide transistor O-TFT. As shown in FIG. 6B, the fourth insulating layer 40 may commonly overlap the pixels and may cover the second semiconductor pattern SP2.

As shown in FIGS. 6A and 6B, the gate GT2 of the oxide transistor O-TFT may be located on the fourth insulating layer 40. The gate GT2 of the oxide transistor O-TFT may be a portion of a metal pattern. The gate GT2 of the oxide transistor O-TFT may overlap the active area AC2.

A fifth insulating layer 50 may be located on the fourth insulating layer 40 and may cover the gate GT2. A first connection electrode CNE1 may be located on the fifth insulating layer 50. The first connection electrode CNE1 may be connected to the drain area DE1 of the silicon transistor S-TFT via a contact hole defined through the first, second, third, fourth, and fifth insulating layers 10, 20, 30, 40, and 50.

A sixth insulating layer 60 may be located on the fifth insulating layer 50. A second connection electrode CNE2 may be located on the sixth insulating layer 60. The second connection electrode CNE2 may be connected to the first connection electrode CNE1 via a contact hole defined through the sixth insulating layer 60. A seventh insulating layer 70 may be located on the sixth insulating layer 60 and may cover the second connection electrode CNE2. An eighth insulating layer 80 may be located on the seventh insulating layer 70.

Each of the sixth insulating layer 60, the seventh insulating layer 70, and the eighth insulating layer 80 may be an organic layer. As an example, each of the sixth insulating layer 60, the seventh insulating layer 70, and the eighth insulating layer 80 may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic-based polymer, an imide-based polymer, an aryl ether-based polymer, an amide-based polymer, a fluorine-based polymer, a p-xylene-based polymer, a vinyl alcohol-based polymer, or blends thereof.

The third light emitting element LD3 may include the first electrode AE3 (or a pixel electrode), a light emitting layer EL3, and a second electrode CE (or a common electrode). The second electrode CE of the first light emitting element LD1, the second electrode CE of the second light emitting element LD2, and the second electrode CE of the third light emitting element LD3 may be integrally provided with each other. That is, the second electrode CE may be commonly provided to the first light emitting element LD1, the second light emitting element LD2, and the third light emitting element LD3.

The first electrode AE3 of the third light emitting element LD3 may be located on the eighth insulating layer 80. The first electrode AE3 of the third light emitting element LD3 may be a semi-transmissive electrode, a transmissive electrode, or a reflective electrode. According to some embodiments, the first electrode AE3 of the third light emitting element LD3 may include a reflective layer formed of Ag, Mg, Al, Pt, Pd, Au, Ni, Nd, Ir, Cr, or compounds thereof and a transparent or semi-transparent electrode layer formed on the reflective layer. The transparent or semi-transparent electrode layer may include at least one selected from the group consisting of indium tin oxide (ITO), indium zinc oxide (IZO), indium gallium zinc oxide (IGZO), zinc oxide (ZnO), indium oxide (In2O3), and aluminum-doped zinc oxide (AZO). For instance, the first electrode AE3 of the third light emitting element LD3 may include a stack structure of ITO/Ag/ITO.

A pixel definition layer PDL may be located on the eighth insulating layer 80. The pixel definition layer PDL may have a light absorbing property. For example, the pixel definition layer PDL may have a black color. The pixel definition layer PDL may include a black coloring agent. The black coloring agent may include a black dye or a black pigment. The black coloring agent may include a metal material, such as carbon black, chromium, or an oxide thereof. The pixel definition layer PDL may correspond to a light blocking pattern having a light blocking property.

The pixel definition layer PDL may cover a portion of the first electrode AE3 of the third light emitting element LD3. As an example, the pixel definition layer PDL may be provided with a second opening PDL-OP2 defined therethrough to expose a portion of the first electrode AE3 of the third light emitting element LD3. The pixel definition layer PDL may increase a distance between an edge of the first electrode AE3 of the third light emitting element LD3 and the second electrode CE. Accordingly, an occurrence of arc on the edge of the first electrode AE3 by the pixel definition layer PDL may be prevented or reduced.

According to some embodiments, a hole control layer may be located between the first electrode AE3 and the light emitting layer EL3. The hole control layer may include a hole transport layer and may further include a hole injection layer. An electron control layer may be located between the light emitting layer EL3 and the second electrode CE. The electron control layer may include an electron transport layer and may further include an electron injection layer. The hole control layer and the electron control layer may be commonly formed over the plural pixels PX (refer to FIG. 5A) using an open mask.

The encapsulation layer 140 may be located on the light emitting element layer 130. The encapsulation layer 140 may include an inorganic layer 141, an organic layer 142, and an inorganic layer 143, which are sequentially stacked, however, layers included in the encapsulation layer 140 should not be limited thereto or thereby.

The inorganic layers 141 and 143 may protect the light emitting element layer 130 from moisture and oxygen, and the organic layer 142 may protect the light emitting element layer 130 from a foreign substance such as dust particles. The inorganic layers 141 and 143 may include a silicon nitride layer, a silicon oxynitride layer, a silicon oxide layer, a titanium oxide layer, or an aluminum oxide layer. The organic layer 142 may include an acrylic-based organic layer, however, it should not be limited thereto or thereby.

The sensor layer 200 may be located on the display panel 100. The sensor layer 200 may be referred to as a sensor, an input sensing layer, or an input sensing panel. The sensor layer 200 may include a base layer 210, a first conductive layer 220, a sensing insulating layer 230, and a second conductive layer 240.

The base layer 210 may be located directly on the display panel 100. The base layer 210 may be an inorganic layer including at least one of silicon nitride, silicon oxynitride, or silicon oxide. According to some embodiments, the base layer 210 may be an organic layer including an epoxy resin, an acrylic resin, or an imide-based resin. The base layer 210 may have a single-layer structure or a multi-layer structure of layers stacked in the third direction DR3.

Each of the first conductive layer 220 and the second conductive layer 240 may have a single-layer structure or a multi-layer structure of layers stacked in the third direction DR3. The first conductive layer 220 and the second conductive layer 240 may include conductive lines to define sensing electrodes having a mesh shape. The conductive lines may not overlap a first opening PDL-OP1, the second opening PDL-OP2, and openings PDP-OP and may overlap the pixel definition pattern PDP and the pixel definition layer PDL. The sensing electrodes defined by the first conductive layer 220 and the second conductive layer 240 may overlap at least the third area DP-A3 shown in FIG. 5A.

The conductive layer having the single-layer structure may include a metal layer or a transparent conductive layer. The metal layer may include molybdenum, silver, titanium, copper, aluminum, or alloys thereof. The transparent conductive layer may include a transparent conductive oxide, such as indium tin oxide (ITO), indium zinc oxide (IZO), zinc oxide (ZnO), indium zinc tin oxide (ITZO), or the like.

In addition, the transparent conductive layer may include conductive polymer such as PEDOT, metal nanowire, graphene, or the like.

The conductive layer having the multi-layer structure may include metal layers. The metal layers may have a three-layer structure of titanium/aluminum/titanium. The conductive layer having the multi-layer structure may include at least one metal layer and at least one transparent conductive layer.

The sensing insulating layer 230 may be located between the first conductive layer 220 and the second conductive layer 240. The sensing insulating layer 230 may include an inorganic layer. The inorganic layer may include at least one of aluminum oxide, titanium oxide, silicon oxide, silicon nitride, silicon oxynitride, zirconium oxide, or hafnium oxide.

According to some embodiments, the sensing insulating layer 230 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyimide-based resin, or a perylene-based resin.

The anti-reflective layer 300 may be located on the sensor layer 200. The anti-reflective layer 300 may include a division layer 310, a first color filter 321, a second color filter 322, a third color filter 323, and a planarization layer 330.

Materials for the division layer 310 should not be particularly limited as long as the materials absorb a light. The division layer 310 may have a black color and may have a black coloring agent. The black coloring agent may include a black dye or a black pigment. The black coloring agent may include a metal material, such as carbon black, chromium, or an oxide thereof.

The division layer 310 may cover the second conductive layer 240 of the sensor layer 200. The division layer 310 may prevent or reduce instances of external light being reflected by the second conductive layer 240. The division layer 310 may overlap the second area DP-A2 (refer to FIG. 7) and the third area DP-A3 and may not overlap the first area DP-A1 (refer to FIG. 7). That is, as the division layer 310 is not located in the first area DP-A1 (refer to FIG. 7), the transmittance of the first area DP-A1 may be improved.

The division layer 310 may be provided with a second opening 310-OP2 defined therethrough. The second opening 310-OP2 may overlap the first electrode AE3 of the third light emitting element LD3. The third color filter 323 may overlap the third area DP-A3. The third color filter 323 may overlap the first electrode AE3 of the third light emitting element LD3. The third color filter 323 may cover the second opening 310-OP2. The third color filter 323 may be in contact with the division layer 310.

The planarization layer 330 may cover the division layer 310 and the third color filter 323. The planarization layer 330 may include an organic material and may provide a flat surface thereon. According to some embodiments, the planarization layer 330 may be omitted.

FIG. 7 shows the second area DP-A2 to which the fourth insulating layer 40 of the insulating pattern shown in FIG. 6A is applied. In FIG. 7, different from the first pixel circuit PC1, the oxide transistor O-TFT of the second pixel circuit PC2 may not be included. Some details of the components of the first pixel PX1 and the second pixel PX2, which are commonly included in the third pixel PX3 and described with reference to FIGS. 6A and 6B, may be omitted.

The first electrode AE1 of the first light emitting element LD1 may be electrically connected to the first pixel circuit PC1 located in the second area DP-A2. The first electrode AE1 of the first light emitting element LD1 may be electrically connected to the silicon transistor S-TFT or the oxide transistor O-TFT. FIG. 7 shows the first electrode AE1 of the first light emitting element LD1 connected to the silicon transistor S-TFT.

The first electrode AE1 of the first light emitting element LD1 may be electrically connected to the first pixel circuit PC1 via the connection line TWL and connection electrodes CNE1', CNE2', and CPN. According to some embodiments, one of the connection electrodes CNE1' and CPN may be omitted. The connection electrode CNE1' may directly connect the connection line TWL to the silicon transistor S-TFT. According to some embodiments, the connection electrode CNE2' may be omitted, and the first electrode AE1 may be directly connected to the connection line TWL.

The connection line TWL may overlap the transmission area TA. The connection line TWL may include a light transmissive material. The connection line TWL may include a transparent conductive oxide (TCO), such as indium tin oxide (ITO), indium zinc oxide (IZO), indium gallium zinc oxide (IGZO), zinc oxide (ZnO), indium oxide ($In_2O_3$), or the like. Although the connection line TWL overlaps the transmission area TA through which the optical signal is transmitted, the connection line TWL that is transparent may reduce a distortion of optical signals such as diffraction.

According to some embodiments, the connection line TWL may overlap the first area DP-A1 and the second area DP-A2 and may be located on the third insulating layer 30. The fifth insulating layer 50 may cover the connection line TWL. The connection line TWL may not overlap the third area DP-A3 (refer to FIG. 6A).

The connection line TWL may be located on the same insulating layer on which the second semiconductor pattern SP2 is arranged as the second semiconductor pattern SP2, and the connection line TWL may be formed of the same bare oxide semiconductor layer as the second semiconductor pattern SP2. The bare oxide semiconductor layer may be divided into a plurality of patterns through an etching process, and these patterns may include the second semiconductor pattern SP2 and the connection line TWL.

However, because a subsequent process performed on the second semiconductor pattern SP2 is not completely the same as a subsequent process performed on the connection line TWL, the second semiconductor pattern SP2 and the connection line TWL may have different electrical properties from each other. The connection line TWL may have a conductivity corresponding to the source area SE2 and the drain area DE2 of the second semiconductor pattern SP2. Hereinafter, the connection line TWL and the source area SE2 of the second semiconductor pattern SP2 will be mainly described.

The connection line TWL and the source area SE2 of the second semiconductor pattern SP2 may have the conductivity higher than that of the active area AC2 of the second semiconductor pattern SP2. The connection line TWL and the source area SE2 of the second semiconductor pattern SP2 may have a higher content of fluorine element compared to that of the active area AC2 of the second semiconductor pattern SP2. In the process of forming the fourth insulating layer 40 of the insulating pattern, a fluorinated gas such as $CF_4$ and/or $SF_6$ may be used as an etching gas, and this is because fluorine is substituted for oxygen in the transparent conductive oxide (TCO). A dry etching process using the fluorinated gas may have similar results to that obtained when the transparent conductive oxide (TCO) is doped with fluorine.

The conductivity of the reduced transparent conductive oxide (TCO) may increase. The active area AC2 of the second semiconductor pattern SP2 may have a relatively low fluorine content because the gate GT2 blocks the fluorinated gas.

The connection line TWL may have a conductivity higher than that of the source area SE2 of the second semiconductor pattern SP2. A doping concentration of the connection line TWL and the source area SE2 of the second semiconductor pattern SP2 may be adjusted through a doping process. The connection line TWL may further include aluminum (Al), arsenic (As), boron (B), or silicon (Si), which is used as a dopant, compared with the source area SE2 of the second semiconductor pattern SP2. The connection line TWL may have a relatively higher dopant content of the dopant than that of the source area SE2 of the second semiconductor pattern SP2. Processes of forming the second semiconductor pattern SP2 and the connection line TWL will be described in detail later.

The pixel definition pattern PDP may be formed on the eighth insulating layer 80 to overlap the first area DP-A1. The pixel definition pattern PDP may include the same material as the pixel definition layer PDL and may be formed through the same processes as those of the pixel definition layer PDL. The pixel definition pattern PDP may cover a portion of the first electrode AE1 of the first light emitting element LD1. As an example, the pixel definition pattern PDP may cover an edge of the first electrode AE1 of the first light emitting element LD1 and may prevent or reduce the occurrence of the arc as does the pixel definition layer PDL. In the first area DP-A1, an area that overlaps the first electrode AE1 of the first light emitting element LD1 and the pixel definition pattern PDP may be defined as an element area EA, and the other area may be defined as the transmission area TA.

The division layer 310 may be provided with a first opening 310-OP1 defined therethrough. The first opening 310-OP1 may overlap the first electrode AE2 of the second light emitting element LD2. The first color filter 321 may overlap the first area DP-A1, and the second color filter 322 may overlap the second area DP-A2. Each of the first color filter 321 and the second color filter 322 may overlap a corresponding electrode among the first electrodes AE1 and AE2.

Because the division layer 310 does not overlap the first area DP-A1, the first color filter 321 may be spaced apart from the division layer 310. That is, the first color filter 321 may not be in contact with the division layer 310. The second color filter 322 may cover the first opening 310-OP1. The planarization layer 330 may cover the division layer 310, the first color filter 321, and the second color filter 322.

Figure 8A:
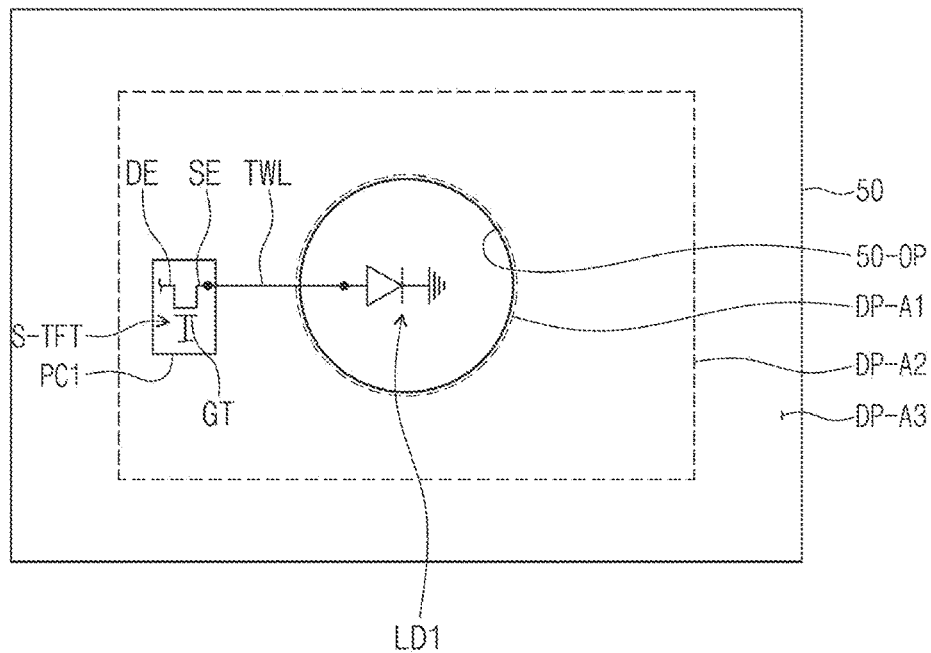
FIGS. 8A and 8B are enlarged plan views showing a portion of the display panel of FIG. 5A.
Figure 8B:
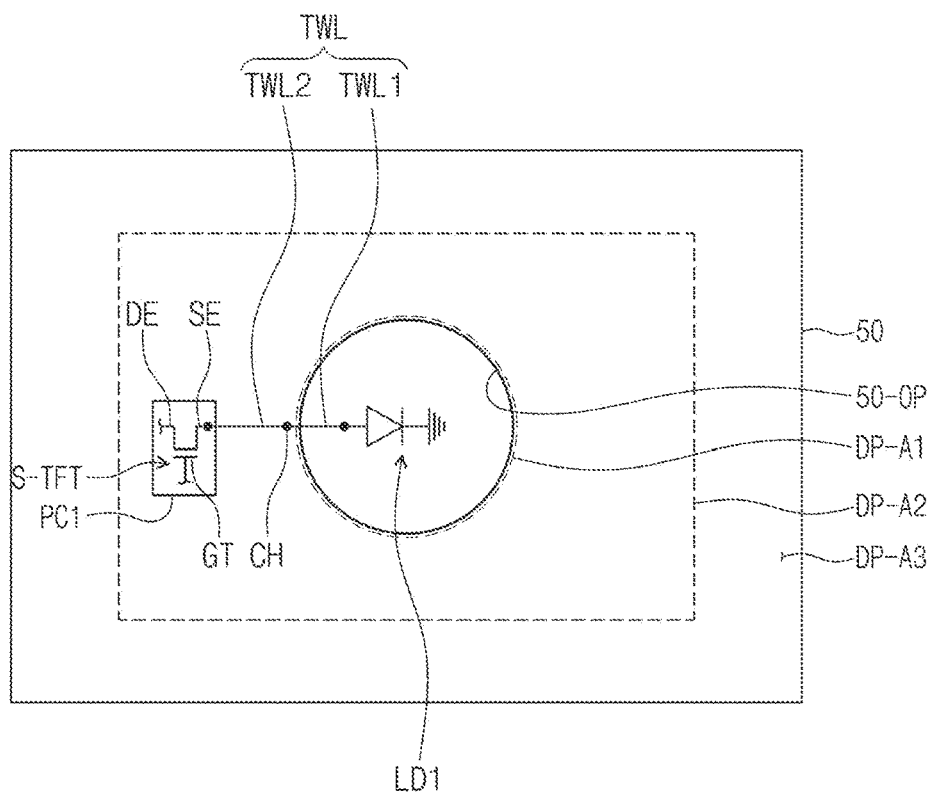
Figure 9:
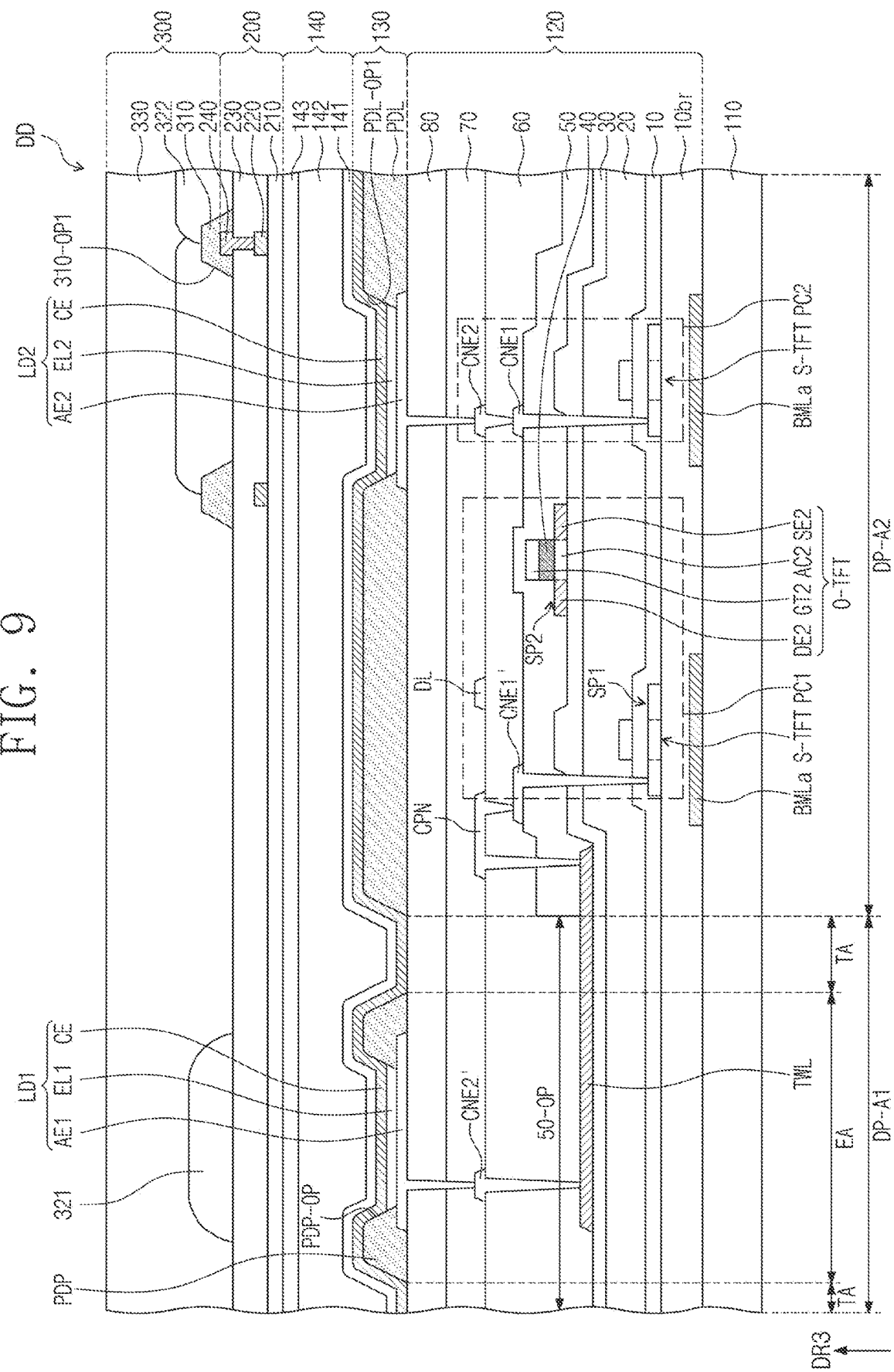
FIG. 9 is a cross-sectional view showing a first area and a second area of a display device according to some embodiments of the present disclosure.

FIGS. 8A and 8B are plan views showing a portion of the display panel DP of FIG. 5A. FIG. 9 is a cross-sectional view showing a first area DP-A1 and a second area DP-A2 of a display device DD according to some embodiments of the present disclosure. In FIG. 9, the same details on the first area DP-A1 and the second area DP-A2 described with reference to FIGS. 8A and 8B will be omitted.

FIGS. 8A and 8B are plan views showing an opening 50-OP formed through a fifth insulating layer 50 shown in FIG. 9. The opening 50-OP may overlap the first area DP-A1. In FIGS. 8A and 8B, a silicon transistor S-TFT of a first pixel circuit PC1, a first light emitting element LD1, and a connection line TWL, which are arranged around the opening 50-OP are schematically shown.

As shown in FIG. 8A, the connection line TWL may overlap the first area DP-A1 and the second area DP-A2 and may have an integral shape. As shown in FIG. 8B, the connection line TWL may include a first portion TWL1 overlapping the first area DP-A1 and a second portion TWL2 overlapping the second area DP-A2. The first portion TWL1 and the second portion TWL2 may be arranged on different layers from each other.

Referring to FIG. 9, a portion of the connection line TWL may be exposed through the opening 50-OP without being covered by the fifth insulating layer 50. A fluorinated gas such as CF4 and/or SF6 may be used as an etching gas to form the opening 50-OP, and a conductivity of the connection line TWL may increase during the etching process. The portion of the connection line TWL exposed through the opening 50-OP may be covered by a sixth insulating layer 60 filled in the opening 50-OP.

Different from the connection line TWL, a source area SE2 of a second semiconductor pattern SP2 may not be exposed to the etching gas during the etching process of forming the opening 50-OP. Accordingly, the connection line TWL exposed to the etching gas may have the conductivity higher than that of the source area SE2 of the second semiconductor pattern SP2. The connection line TWL may have a fluorine element content higher than that of the active area AC2 of the second semiconductor pattern SP2.

FIGS. 10A to 10H are cross-sectional views showing a method of manufacturing a display device DD according to some embodiments of the present disclosure.

FIGS. 10A to 10H show the manufacturing process with respect to the cross-section shown in FIG. 9. The second light emitting element LD2 and the second pixel circuit PC2 are not shown in FIGS. 10A to 10H, however, the second light emitting element LD2 and the second pixel circuit PC2 may be formed through the same processes as those of the first light emitting element LD1 and the first pixel circuit PC1 described below. According to some embodiments, the third area DP-A3 shown in FIG. 6A may be formed through the same processes as those of the first area DP-A1 and the second area DP-A2 described below.

Figure 10A:
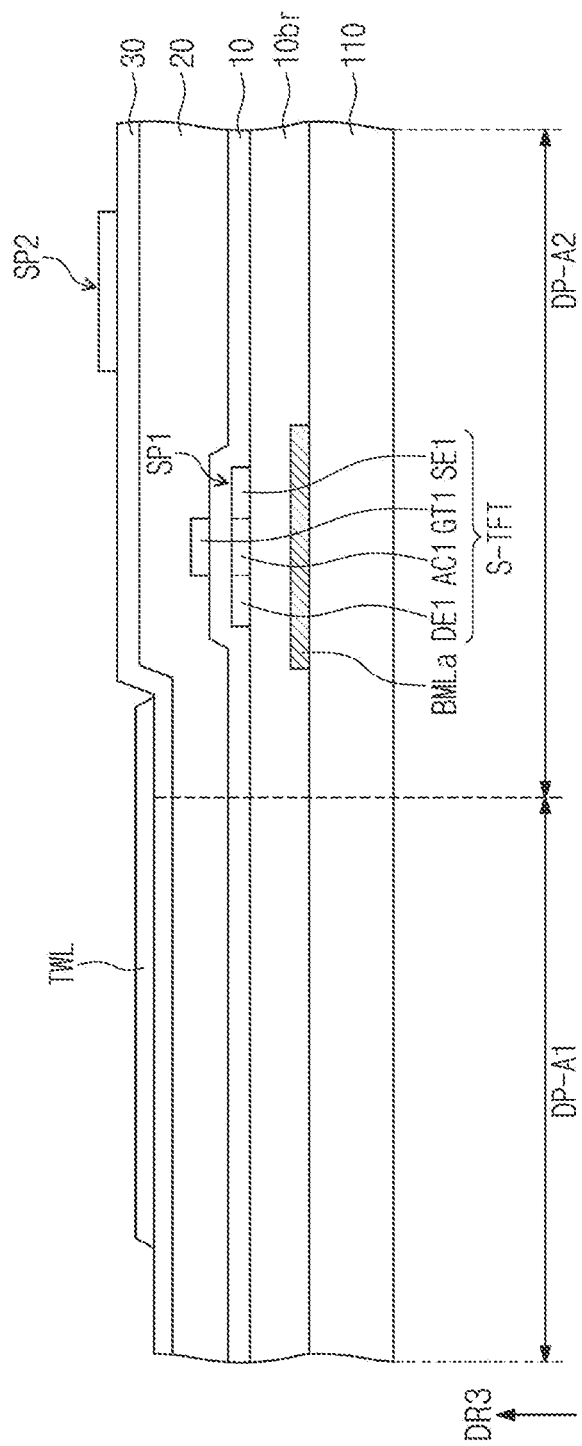
FIGS. 10A to 10H are cross-sectional views showing a method of manufacturing a display device according to some embodiments of the present disclosure.

Referring to FIG. 10A, the first rear surface metal layer BMLa and the silicon transistor S-TFT, which overlap the second area DP-A2, may be formed. An insulating layer, a semiconductor layer, and a conductive layer may be formed on the base layer 110 by a coating or depositing process. Then, the insulating layer, the semiconductor layer, and the conductive layer may be selectively patterned through a photolithography process and an etching process. According to some embodiments, the silicon transistor S-TFT of the second pixel circuit PC2 and the third pixel circuit PC3 may be formed through the same and single process as the silicon transistor S-TFT of the first pixel circuit PC1.

As shown in FIG. 10A, the oxide semiconductor layer SP2 and TWL may be formed on the third insulating layer 30. The oxide semiconductor layer SP2 and TWL includes an oxide semiconductor pattern SP2 and a connection line TWL. The bare oxide semiconductor layer may be formed and patterned to form the oxide semiconductor pattern SP2 overlapping the second area DP-A2 and the connection line TWL overlapping at least the first area DP-A1. The connection line TWL overlapping the first area DP-A1 and the second area DP-A2 is shown as a representative example.

According to some embodiments, the oxide semiconductor pattern of the second pixel circuit PC2 and the oxide semiconductor pattern of the third pixel circuit PC3 may be formed through the same and single process as the oxide semiconductor layer SP2 and TWL. That is, the bare oxide semiconductor layer may be patterned to form the oxide semiconductor patterns of the second pixel circuit PC2 and the third pixel circuit PC3.

Figure 10B:
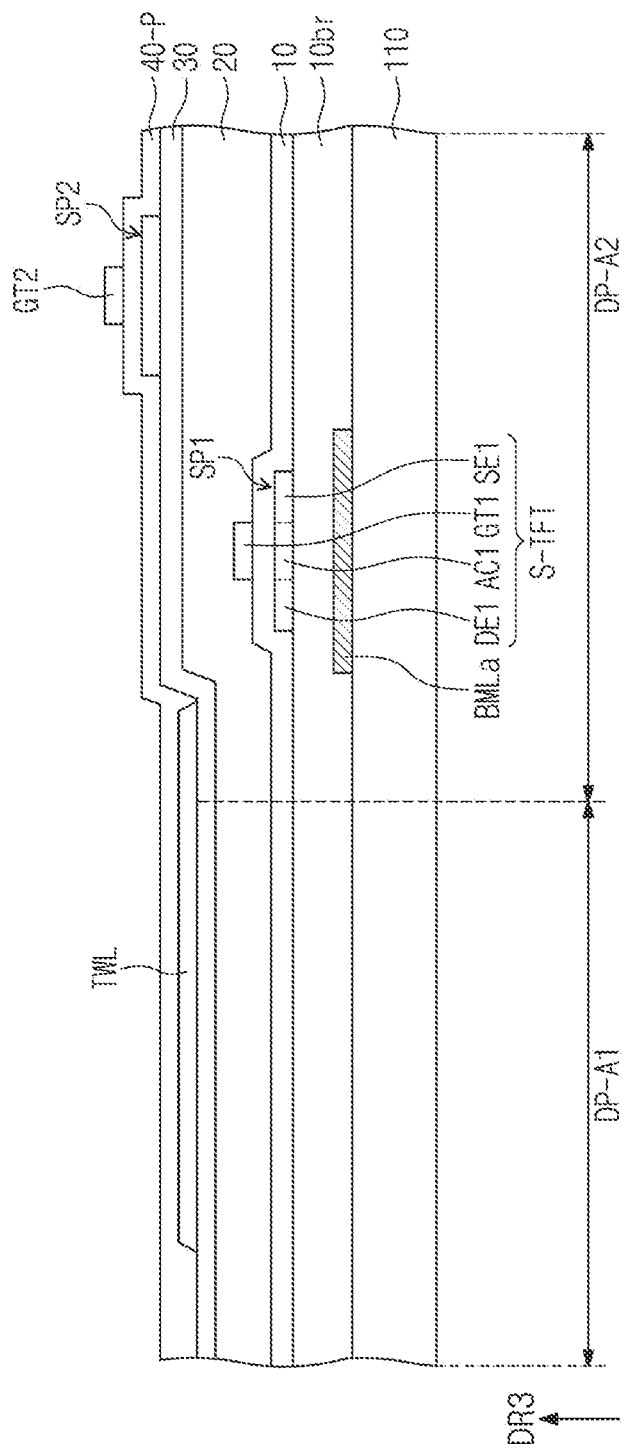

Referring to FIG. 10B, a preliminary insulating layer 40-P may be formed on the third insulating layer 30 to cover the oxide semiconductor pattern SP2 and the connection line TWL. The preliminary insulating layer 40-P may be formed by depositing an inorganic material.

Then, the gate GT2 of the oxide transistor O-TFT (refer to FIG. 9) may be formed on the preliminary insulating layer 40-P to overlap a portion of the oxide semiconductor pattern SP2. A preliminary conductive layer may be formed and patterned to form the gate GT2. According to some embodiments, the gate GT2 of the second pixel circuit PC2 and the third pixel circuit PC3 may be formed through the same and single process as the gate GT2 of the first pixel circuit PC1.

Figure 10C:
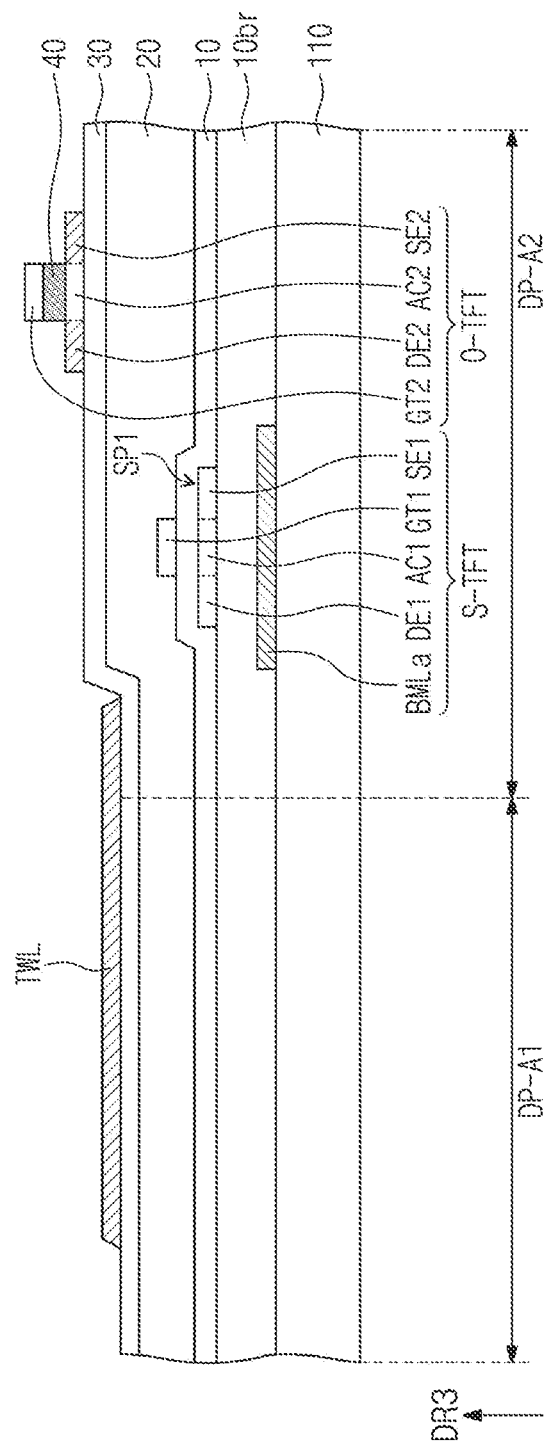

Referring to FIG. 10C, an insulating pattern 40 may be formed. The preliminary insulating layer 40-P of FIG. 10B may be dry etched to form the insulating pattern 40. The etching gas may include the fluorinated gas such as CF4 and/or SF6. During the dry etching process, an oxygen vacancy may occur in the transparent conductive oxide (TCO), and this is replaced by fluorine. The reduced transparent conductive oxide (TCO) may be metallized, and the conductivity may be improved.

FIG. 10C shows the source area SE2 and the drain area DE2 of the oxide semiconductor pattern SP2 to be distinguished from the active area AC2 of the oxide semiconductor pattern SP2. The active area AC2 of the second semiconductor pattern SP2, in which the fluorinated gas is blocked by the gate GT2, may have a relatively lower conductivity and may have a channel property. Because the source area SE2 of the oxide semiconductor pattern SP2 and the connection line TWL go through the same dry etching process, the source area SE2 of the oxide semiconductor pattern SP2 and the connection line TWL may have substantially the same conductivity at the present stage.

According to some embodiments, the dry etching process for the preliminary insulating layer 40-P may be omitted. The display device DD formed in this way is shown in FIG. 6B.

Figure 10D:
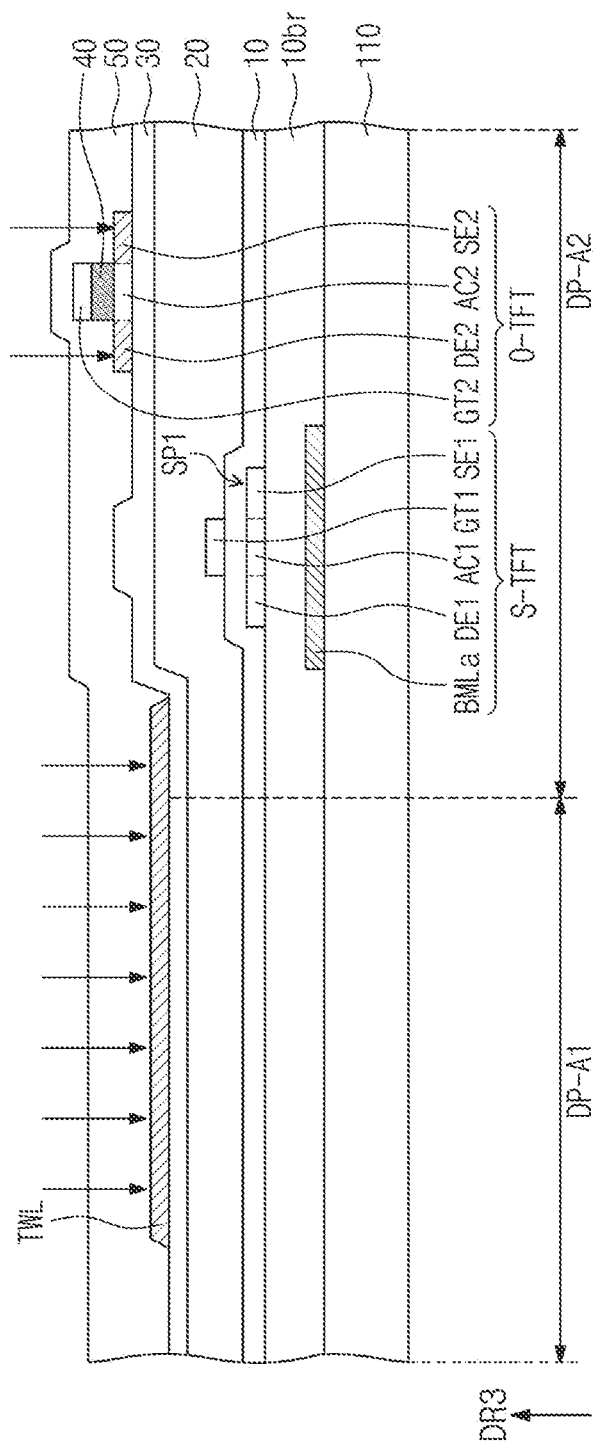

Referring to FIG. 10D, the fifth insulating layer 50 may be formed on the third insulating layer 30 to cover the connection line TWL and the gate GT2. The fifth insulating layer 50 may be formed by depositing an inorganic material.

Then, a doping process may be performed. The connection line TWL and the source area SE2 and the drain area DE2 of the oxide semiconductor pattern SP2 may be doped. An N-type dopant or a P-type dopant may be used in accordance with properties of the oxide transistor O-TFT. The connection line TWL, the source area SE2, and the drain area DE2 may be doped with the same dopant. Aluminum (Al), arsenic (As), boron (B), or silicon (Si) may be used as the dopant, however, the dopant should not be limited thereto or thereby.

The conductivity of the connection line TWL may increase through the doping process. Through doping process the conductivity of the source area SE2 and the drain area DE2 of the oxide semiconductor pattern SP2 may further increase. According to some embodiments, only the connection line TWL may be doped using an additional mask. According to some embodiments, the doping process may be omitted.

Figure 10E:
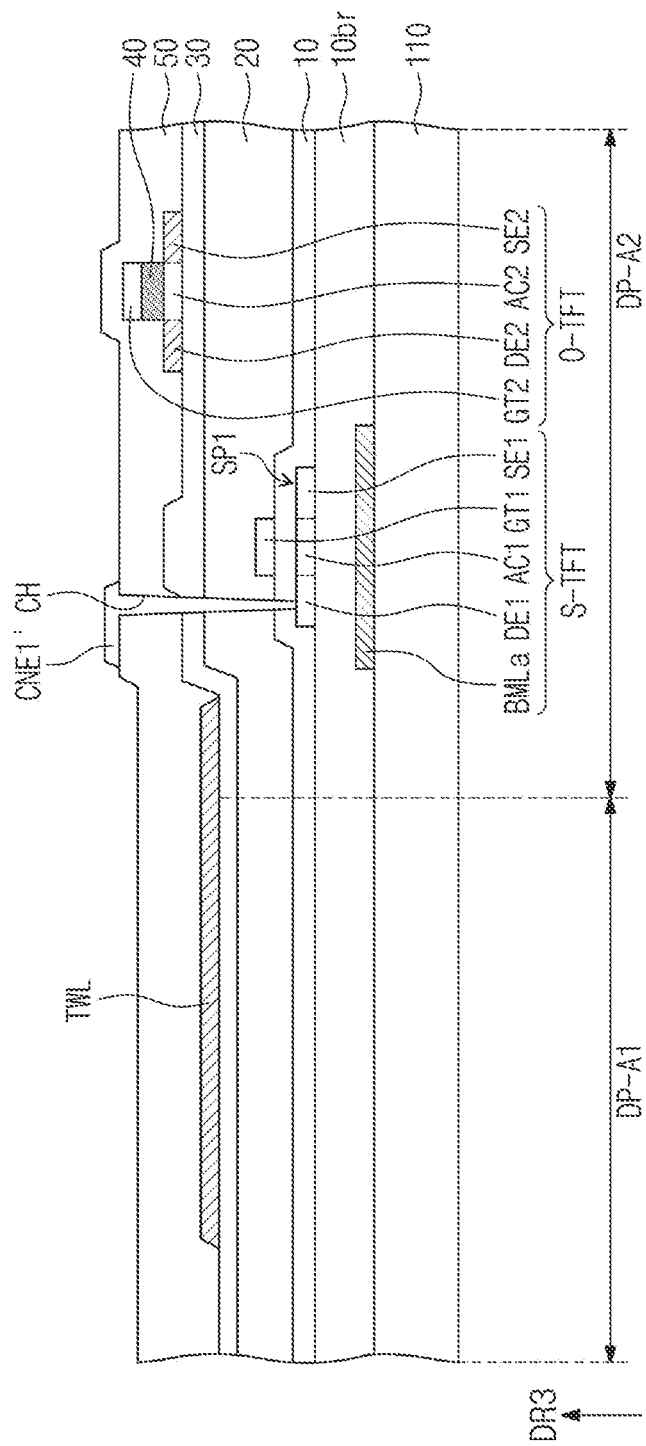

Then, referring to FIG. 10E, the contact hole CH may be formed through the first, second, third, fourth, and fifth insulating layers 10, 20, 30, 40, and 50. The drain area DE1 of the silicon transistor S-TFT may be exposed through the contact hole CH.

After that, the conductive pattern may be formed on the fifth insulating layer 50. The conductive pattern may include the first connection electrode CNE1'.

Figure 10F:
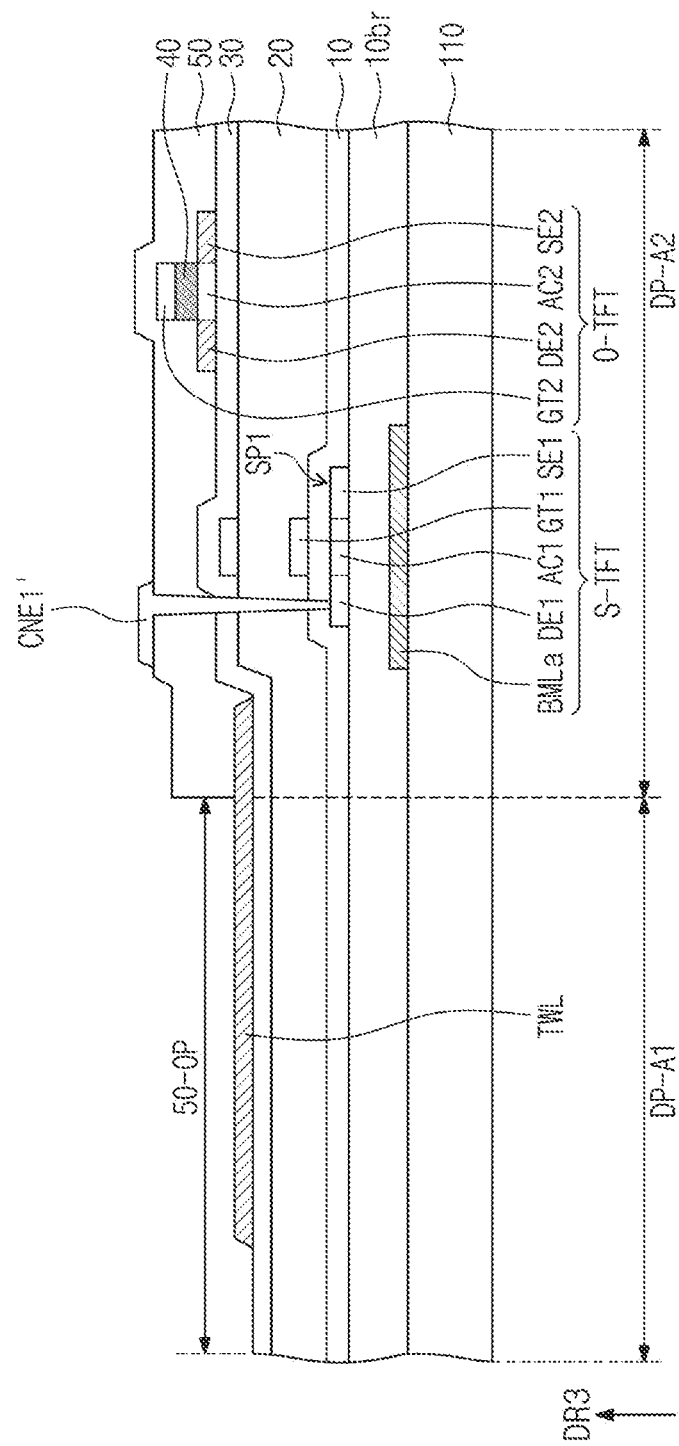

Referring to FIG. 10F, the opening 50-OP may be formed through the fifth insulating layer 50 to expose at least a portion of the connection line TWL. The dry etching process described in the process of forming the fourth insulating layer 40 may be performed. A portion of the connection line TWL may be further reduced by the fluorinated gas. Due to the process performed in FIG. 10F, the conductivity of the connection line TWL may increase. The portion of the connection line TWL may have a conductivity higher than that of the source area SE2 of the oxide semiconductor pattern SP2.

According to some embodiments, the opening 50-OP may not be formed through the fifth insulating layer 50. The display device DD manufactured by the manufacturing process from which the dry etching process of FIG. 10F is omitted is shown in FIG. 7.

Figure 10G:
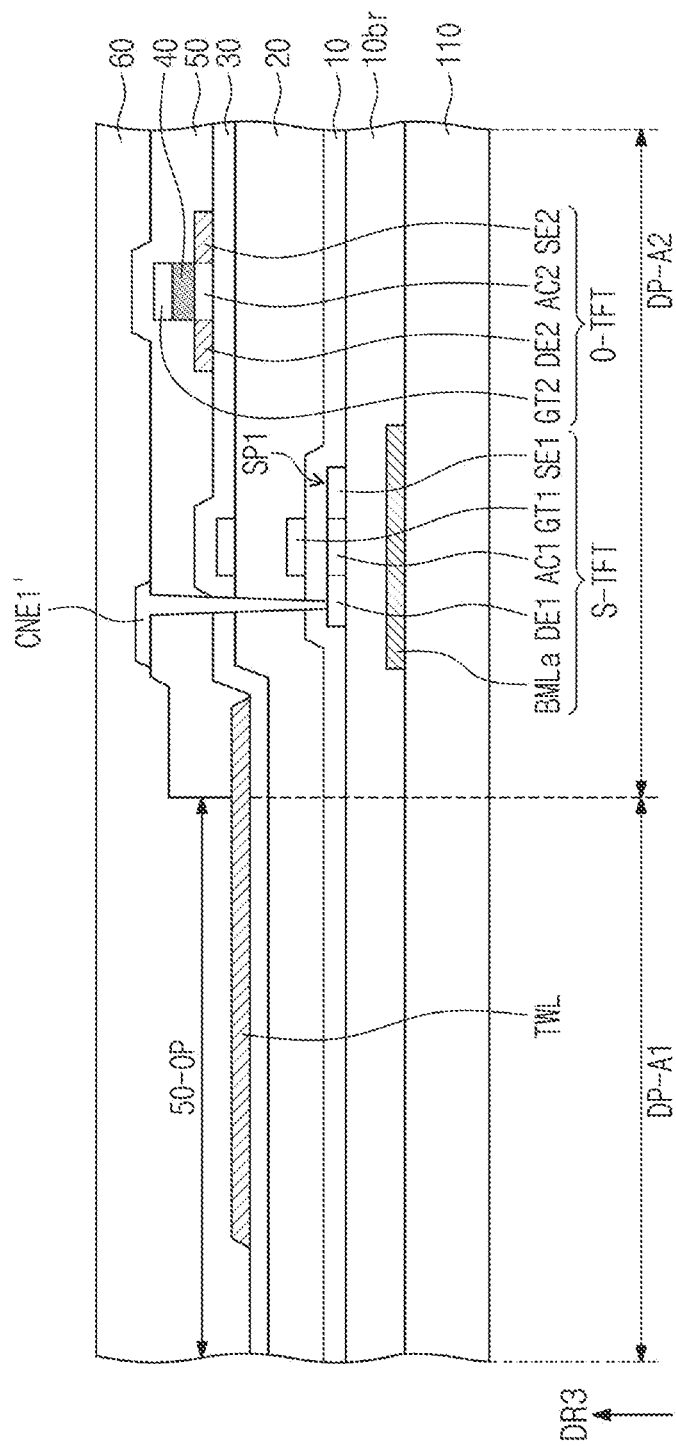

Then, referring to FIG. 10G, the sixth insulating layer 60 may be formed on the fifth insulating layer 50. The sixth insulating layer 60 may be filled in the opening 50-OP. The sixth insulating layer 60 may include an organic material and may be formed by a coating, depositing, or printing process.

Figure 10H:
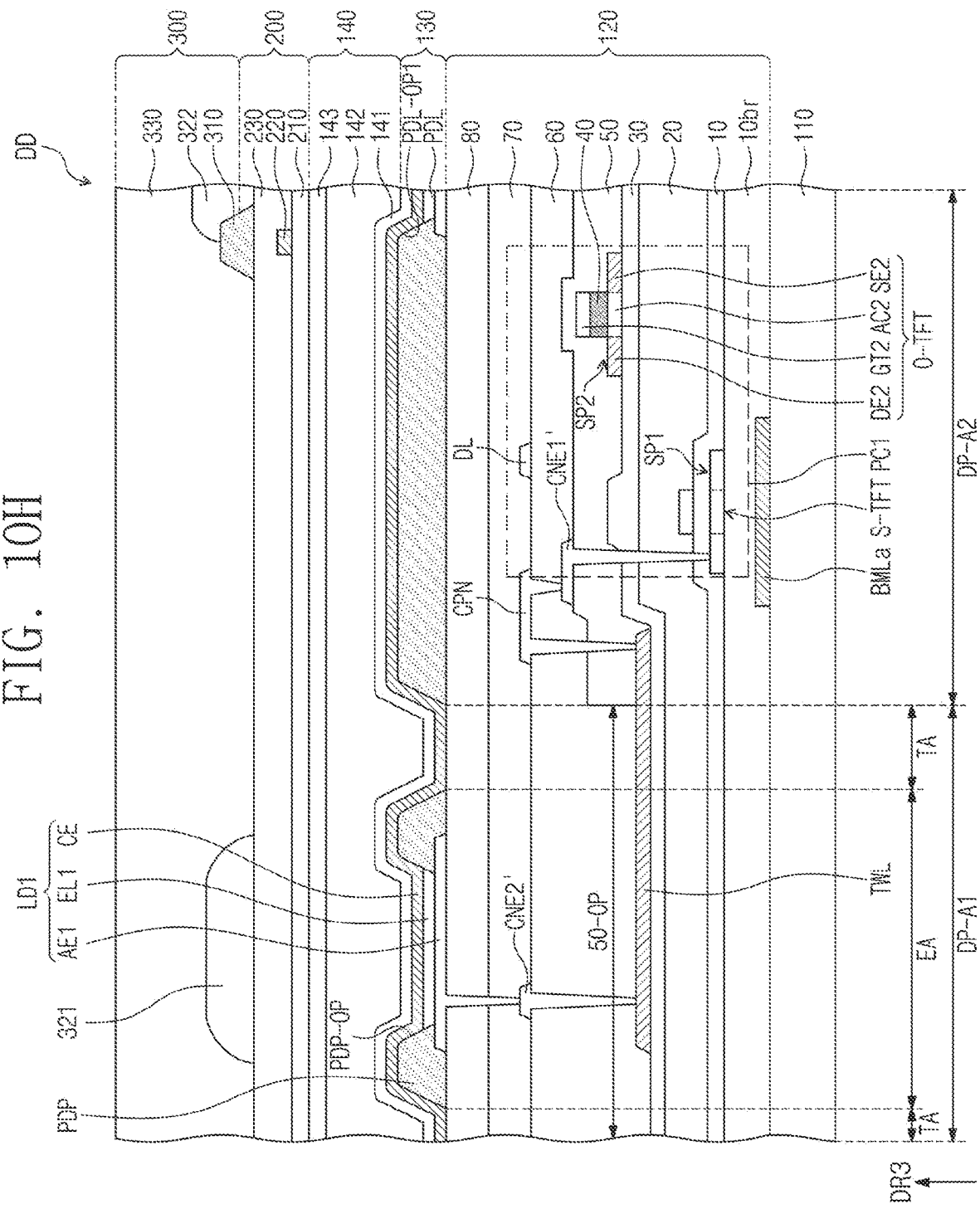

Then, a process of forming the contact hole, a process of forming the conductive pattern, and a process of forming the insulating layer may be performed. Accordingly, the connection electrodes CNE2' and CPN and the data line DL, which are shown in FIG. 10H, may be formed. Several additional processes may be performed, and the circuit layer 120 shown in FIG. 10H may be completed. Next, the first light emitting element LD1 may be formed on the eighth insulating layer 80. Processes of forming the light emitting element layer 130, the encapsulation layer 140, the sensor layer 200, and the anti-reflective layer 300 may include a process of forming and patterning an insulating layer, a process of forming and patterning a conductive layer, and a process of forming a contact hole, which are well known, and thus, some details thereof may be omitted.

Although the embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims, and their equivalents.

What is claimed is:

1. A display device comprising:
   a display panel comprising a base layer comprising a display area comprising a first area and a second area adjacent to the first area and a peripheral area adjacent to the display area, an insulating layer on the base layer, and first and second pixels on the base layer,
   the first pixel comprising:
      a first light emitting element in the first area; and
      a first pixel circuit electrically connected to the first light emitting element,
   the second pixel comprising:
      a second light emitting element in the second area; and
      a second pixel circuit electrically connected to the second light emitting element and in the second area, the first pixel circuit comprising:
- a first transistor comprising an oxide semiconductor pattern comprising a drain area, an active area, and a source area, and a gate overlapping the active area and in the second area or the peripheral area;
- a second transistor comprising a silicon semiconductor pattern comprising a drain area, an active area, and a source area, and a gate overlapping the active area and in the second area or the peripheral area; and
- a connection line electrically connecting the first transistor or the second transistor to the first light emitting element, overlapping at least the first area, on the same layer as the oxide semiconductor pattern, and comprising a transparent conductive oxide.

2. The display device of claim 1, wherein the display area further comprises a third area adjacent to the second area, the display panel further comprises a third pixel in the third area, the third pixel comprising:
- a third light emitting element in the third area; and
- a third pixel circuit electrically connected to the third light emitting element and in the third area, wherein a number of the first light emitting elements is smaller than a number of the third light emitting elements based on a unit area.

3. The display device of claim 1, wherein the insulating layer comprises a first insulating layer and a second insulating layer, the oxide semiconductor pattern is on the first insulating layer, the silicon semiconductor pattern is under the first insulating layer, and the second insulating layer covers the oxide semiconductor pattern.

4. The display device of claim 3, wherein the second insulating layer covers the connection line.

5. The display device of claim 3, wherein the second insulating layer has an opening defined therethrough to correspond to the first area, and at least a portion of the connection line is exposed without being covered by the second insulating layer.

6. The display device of claim 5, wherein the insulating layer further comprises a third insulating layer filled in the opening and on the second insulating layer.

7. The display device of claim 6, wherein the first pixel circuit further comprises a connection electrode, and the connection electrode is on the third insulating layer and connected to the connection line via a contact hole defined through the third insulating layer.

8. The display device of claim 1, wherein the connection line has a conductivity higher than a conductivity of the drain area and the source area of the oxide semiconductor pattern.

9. The display device of claim 1, wherein the connection line has a higher fluorine content than a fluorine content of the drain area and the source area of the oxide semiconductor pattern.

10. The display device of claim 1, wherein the connection line further comprises aluminum (Al), arsenic (As), boron (B), or silicon (Si) compared with the drain area and the source area of the oxide semiconductor pattern.

11. The display device of claim 1, wherein the insulating layer comprises an insulating pattern overlapping the gate of the first transistor and between the gate of the first transistor and the active area of the first transistor, and the drain area and the source area of the first transistor are exposed without being covered by the insulating pattern in a plane.

12. The display device of claim 1, wherein the connection line overlaps the second area.

13. The display device of claim 1, wherein the first pixel circuit further comprises a connection electrode, the first light emitting element comprises a first electrode having an oval shape, the connection electrode is directly connected to the connection line, and the first electrode of the first light emitting element is directly connected to the connection electrode.

14. The display device of claim 13, wherein the second light emitting element comprises a first electrode having a curved edge, and the first electrode of the second light emitting element has an area smaller than an area of the first electrode of the first light emitting element.

15. The display device of claim 1, further comprising a window coupled with the display panel, wherein the window comprises a base film and a bezel pattern overlapping the peripheral area.

16. An electronic device comprising:
- a display device comprising a sensing area configured to enable an optical signal to be transmitted therethrough, a display area adjacent to the sensing area, and a peripheral area adjacent to the display area, the sensing area comprising an element area that overlaps a light emitting element and a transmission area that does not overlap the light emitting element; and
- an electronic module under the display device, overlapping the sensing area, and configured to receive the optical signal, wherein the display device comprises
- a first pixel comprising a first light emitting element in the element area and a first pixel circuit electrically connected to the first light emitting element,
- the first pixel circuit comprises a transistor comprising an oxide semiconductor pattern and in the display area or the peripheral area, and
- a connection line electrically connecting the transistor to the first light emitting element, overlapping at least the display area, on the same layer as the oxide semiconductor pattern, and comprising a transparent conductive oxide.

17. The electronic device of claim 16, wherein the display device further comprises a second pixel comprising a second light emitting element in the display area and a second pixel circuit electrically connected to the second light emitting element and in the display area.

18. The electronic device of claim 16, wherein the display device comprises a window comprising a base film and a bezel pattern overlapping the peripheral area.

19. The electronic device of claim 16, wherein the electronic module comprises a camera module.

20. A method of manufacturing a display device, the display device comprising:
- a first pixel comprising:
  - a first light emitting element in a first area;
  - a first silicon transistor in a second area; and
  - a first oxide transistor in the second area; and
- a second pixel comprising:
  - a second light emitting element in the second area;
  - a second silicon transistor; and
  - a second oxide transistor, the method comprising:
- forming the first silicon transistor overlapping the second area;
- forming an oxide semiconductor layer comprising an oxide semiconductor pattern of the first oxide transistor overlapping the second area and an oxide semiconductor line overlapping at least the first area;
- forming a gate of the first oxide transistor that overlaps an active area of the oxide semiconductor pattern of the first oxide transistor;

forming an insulating layer to cover the gate of the first oxide transistor and the oxide semiconductor line; and forming the first light emitting element on the insulating layer and electrically connected to the oxide semiconductor line.

21. The method of claim 20, further comprising doping the oxide semiconductor line using a dopant.

22. The method of claim 21, wherein the dopant comprises aluminum (Al), arsenic (As), boron (B), silicon (Si), or indium (In).

23. The method of claim 20, further comprising dry etching the insulating layer using a fluorinated gas to form an opening corresponding to the first area through the insulating layer.

24. The method of claim 20, further comprising:
forming the second silicon transistor overlapping the second area;
forming the second oxide transistor overlapping the second area; and
forming the second light emitting element overlapping the second area, wherein the forming of the second oxide transistor comprises:
forming an oxide semiconductor pattern of the second oxide transistor overlapping the second area; and
forming a gate of the second oxide transistor that does not overlap a source area and a drain area of the oxide semiconductor pattern of the second oxide transistor and overlaps an active area of the oxide semiconductor pattern of the second oxide transistor, the forming of the oxide semiconductor pattern of the second oxide transistor is performed through a same and single process as the forming of the oxide semiconductor layer, and the forming of the gate of the second oxide transistor is performed through a same and single process as the forming of the gate of the first oxide transistor.

* * * * *